US012668718B2

(12) United States Patent
Hong et al.

(10) Patent No.: US 12,668,718 B2
(45) Date of Patent: Jun. 30, 2026

(54) COMPOSITION FOR SEMICONDUCTOR PROCESSING AND METHOD OF FABRICATING SEMICONDUCTOR DEVICE USING THE SAME

(71) Applicant: SK enpulse Co., Ltd., Gyeonggi-do (KR)

(72) Inventors: Seung Chul Hong, Seoul (KR); Deok Su Han, Seoul (KR); Kang Sik Myung, Seoul (KR); Han Teo Park, Seoul (KR); Hyeong Ju Lee, Seoul (KR); Yong Soo Choi, Seoul (KR)

(73) Assignee: YCCHEM CO., LTD., Gyeongsangbuk-do (KR)

( * ) Notice: Subject to any disclaimer, the term of this patent is extended or adjusted under 35 U.S.C. 154(b) by 504 days.

(21) Appl. No.: 18/331,193

(22) Filed: Jun. 8, 2023

(65) Prior Publication Data

US 2023/0407135 A1     Dec. 21, 2023

(30) Foreign Application Priority Data

Jun. 15, 2022     (KR) ........................ 10-2022-0073107

(51) Int. Cl.
| *C09G 1/02* | (2006.01) |
| *H10P 52/40* | (2026.01) |
| *H10P 95/00* | (2026.01) |
| *H10W 20/00* | (2026.01) |

(52) U.S. Cl.
CPC .............. *C09G 1/02* (2013.01); *H10P 52/403* (2026.01); *H10P 95/062* (2026.01); *H10W 20/023* (2026.01); *H10W 20/062* (2026.01); *H10W 20/092* (2026.01)

(58) Field of Classification Search
CPC ....... C09G 1/02; H10P 52/403; H10P 95/062; H10W 20/023; H10W 20/062; H10W 20/092; H10W 20/4421; H10W 20/47; C09K 3/1409
See application file for complete search history.

(56) References Cited

U.S. PATENT DOCUMENTS

| | | | |
|---|---|---|---|
| 2005/0079718 A1 | 4/2005 | Siddiqui et al. | |
| 2007/0163998 A1 | 7/2007 | Bian | |
| 2009/0280724 A1* | 11/2009 | Bian ..................... | H10P 95/062 451/41 |
| 2012/0156874 A1 | 6/2012 | Han et al. | |
| 2013/0313225 A1 | 11/2013 | Jin et al. | |
| 2015/0376458 A1 | 12/2015 | Grumbine et al. | |
| 2015/0376459 A1 | 12/2015 | Grumbine et al. | |
| 2015/0376460 A1 | 12/2015 | Grumbine et al. | |
| 2015/0376461 A1 | 12/2015 | Grumbine et al. | |
| 2015/0376463 A1 | 12/2015 | Fu et al. | |
| 2019/0062594 A1 | 2/2019 | Yao et al. | |
| 2019/0382619 A1 | 12/2019 | Shi et al. | |
| 2020/0203172 A1 | 6/2020 | Ballesteros et al. | |
| 2020/0343098 A1 | 10/2020 | Ballesteros et al. | |
| 2022/0056307 A1 | 2/2022 | Guevenc et al. | |
| 2022/0220340 A1 | 7/2022 | Hong et al. | |
| 2022/0375758 A1 | 11/2022 | Ballesteros et al. | |
| 2023/0332016 A1* | 10/2023 | Han ........................ | C09G 1/02 |

FOREIGN PATENT DOCUMENTS

| | | |
|---|---|---|
| CN | 102585704 A | 7/2012 |
| CN | 104334674 A | 2/2015 |
| CN | 105802510 A | 7/2016 |
| CN | 106575614 A | 4/2017 |
| CN | 111334193 A | 6/2020 |
| CN | 113195657 A | 7/2021 |
| CN | 114750051 A | 7/2022 |
| EP | 3670620 A1 | 6/2020 |
| JP | 2005-252298 A | 9/2005 |
| JP | 2007-180534 A | 7/2007 |
| JP | 2015-135968 A | 7/2015 |
| JP | 2015-522669 A | 8/2015 |
| KR | 10-2011-0082223 A | 7/2011 |
| KR | 10-1298520 B1 | 8/2013 |
| KR | 10-1656421 B1 | 9/2016 |
| TW | 201610124 A | 3/2016 |
| WO | 2016107406 A1 | 7/2016 |
| WO | 2020120522 A1 | 6/2020 |

OTHER PUBLICATIONS

Office Action for Chinese Patent Application No. 202310691992.6 issued by the Chinese Patent Office on Jul. 23, 2025.
Office Action for Japanese Patent Application No. 2023-097371 issued by the Japanese Patent Office on Aug. 6, 2024.
Office Action for Taiwanese Patent Application No. 112121962 issued by the Taiwanese Patent Office on Jun. 13, 2024.
Extended European Search Report for the European Patent Application No. 23178077.6 issued by the European Patent Office on Nov. 14, 2023.

* cited by examiner

*Primary Examiner* — Alexandra M Moore
(74) *Attorney, Agent, or Firm* — IP & T GROUP LLP

(57) ABSTRACT

This disclosure relates to a polishing composition that includes at least one abrasive; at least one nitride removal rate reducing agent, an acid or a base; and water. The at least one nitride removal rate reduce agent can include a hydrophobic portion and a hydrophilic portion; in which the hydrophobic portion includes a $C_{16}$ to $C_{22}$ hydrocarbon group and the hydrophilic portion comprises at least one group selected from the group consisting of a phosphate group and a phosphonate group. The polishing composition has a pH of about 2 to about 6.5.

20 Claims, 5 Drawing Sheets

100

100

COMPOSITION FOR SEMICONDUCTOR PROCESSING AND METHOD OF FABRICATING SEMICONDUCTOR DEVICE USING THE SAME

CROSS-REFERENCE TO RELATED APPLICATIONS

This application claims priority under 35 U.S.C. § 119 to Korean Patent Application No. 10-2022-0073107, filed on Jun. 15, 2022, in the Korean Intellectual Property Office, the disclosure of which is incorporated herein by reference in its entirety.

BACKGROUND OF THE DISCLOSURE

Field of the Disclosure

The present disclosure relates to a polishing composition applicable to a process of fabricating and processing a semiconductor, and more particularly, to a polishing composition applicable to a polishing process in a process of fabricating and processing a semiconductor.

Description of Related Art

Chemical mechanical polishing is a technique of polishing the surface of a polishing target to a desired level by injecting polishing slurry into the interface between a polishing pad and the polishing target while rubbing the surface of the polishing target with the polishing pad. As modern chemical mechanical polishing is applied to fabrication of large-scale semiconductor integrated circuits, chemical mechanical polishing is used to planarize the surface of the interlayer insulating film of a transistor device or multi-layer wiring; to planarize various films such as oxide films and nitride films; and to form tungsten or copper wiring. As the degree of integration of a semiconductor device increases and the size of a chip decreases, the surface structure of the semiconductor device becomes more complex and the difference between layers increases. Accordingly, high-resolution lithography and atomic-level planarization technology are required for a chemical mechanical polishing (CMP) process applied to a process of fabricating a semiconductor device. This CMP process is a process of planarizing a film by simultaneously using physical frictional force and chemical reaction. Significantly different polishing results may be obtained even by minute differences in process components and/or process solutions used in the CMP process. Therefore, the precision required for manufacture is increasing, and the design of these process components and/or process solutions is being improved.

SUMMARY OF THE DISCLOSURE

A polishing composition the polishing composition in accordance with one embodiment of the present disclosure, a polishing composition for semiconductor processing includes abrasive grains; and at least one additive, wherein the polishing composition has a value ranging from 1.45 to 1.9 as calculated by Equation 1 below:

$$\frac{R_O^2}{(R_{Cu} \times R_N)}, \qquad \text{[Equation 1]}$$

wherein $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film, wherein, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

In another embodiment, the polishing composition for semiconductor processing may have a value ranging from 110.0 to 230.0 as calculated by Equation 2 below:

$$\left(\frac{R_{Cu}}{R_N}\right)^2 \times \frac{R_O}{100}, \qquad \text{[Equation 2]}$$

wherein $R_O$, $R_N$, and $R_{Cu}$ are as defined in Equation 1.

In one embodiment, the polishing composition for semiconductor processing may have a value ranging from 0.90 to 1.00 as calculated by Equation 3 below:

$$\frac{R_O}{R_{Cu}}, \qquad \text{[Equation 3]}$$

wherein $R_O$ and $R_{Cu}$ are as defined in Equation 1.

In one embodiment, the polishing composition for semiconductor processing may have a value ranging from 1.55 to 2.40 as calculated by Equation 4 below:

$$\frac{R_{Cu}}{R_N}, \qquad \text{[Equation 4]}$$

wherein $R_N$ and $R_{Cu}$ are as defined in Equation 1.

In one embodiment, the abrasive grains may be made of one selected from the group consisting of silica ($SiO_2$), ceria ($CeO_2$), alumina ($Al_2O_3$), zirconia ($ZrO_2$), and a combination thereof.

In one embodiment, the abrasive grains may have a positive (+) zeta potential value in the polishing composition for semiconductor processing.

In one embodiment, the additive may include one selected from the group consisting of an azole-based compound, a phosphoric acid-based compound, a fluorine-based compound, an organic acid, and a combination thereof.

In accordance with another aspect of the present disclosure, provided is a method of fabricating a semiconductor device, the method including preparing a surface plate on which a polishing pad having a polishing surface is mounted; preparing a carrier for accommodating a polishing target; rotating the surface plate and the carrier while placing the polishing surface of the polishing pad and a surface to be polished of the polishing target in contact with each other; and applying the polishing composition for semiconductor processing onto the polishing surface, wherein the polishing composition for semiconductor processing includes abrasive grains and at least one additive and has a value ranging from 1.45 to 1.90 as calculated by Equation 1 below:

$$\frac{R_O^2}{(R_{Cu} \times R_N)},\qquad\text{[Equation 1]}$$

wherein $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film, wherein, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while applying the mixture containing the polishing composition for semiconductor processing at a flow rate of 300 mL/min onto the polishing surface under conditions of a carrier pressurization of 3.0 psi, a carrier rotation speed of 120 rpm, and a surface plate rotation speed of 117 rpm, and then $R_O$, $R_N$, and $R_{Cu}$ are measured.

In one embodiment, the polishing target may include a semiconductor wafer having a through-silicon via.

In one embodiment, the surface plate and the carrier may rotate at a rotation speed of 10 rpm to 500 rpm.

In one embodiment, the polishing composition for semiconductor processing may be applied onto the polishing surface at a flow rate of 10 mL/min to 1,000 mL/min.

In accordance with yet another aspect of the present disclosure, provided is a method of fabricating a semiconductor device, the method including forming a substrate including a via; forming a copper electrode disposed on the via; forming a silicon nitride film on the substrate and the copper electrode; forming a silicon oxide film on the silicon nitride film; and polishing the copper electrode, the silicon nitride film, and the silicon oxide film using a polishing composition for semiconductor processing, wherein the polishing composition for semiconductor processing includes abrasive grains and at least one additive and has a value ranging from 1.45 to 1.90 as calculated by Equation 1 below:

$$\frac{R_O^2}{(R_{Cu} \times R_N)},\qquad\text{[Equation 1]}$$

wherein $R_O$ represents a polishing rate (Å/min) of the polishing composition for semiconductor processing for the silicon oxide film, $R_N$ represents a polishing rate (Å/min) of the polishing composition for semiconductor processing for the silicon nitride film, and $R_{Cu}$ represents a polishing rate (Å/min) of the polishing composition for semiconductor processing for the copper electrode.

In the method of fabricating a semiconductor device according to one embodiment, a value calculated by Equation 1 may range approximately from 1.50 to approximately 1.80.

In the method of fabricating a semiconductor device according to one embodiment, a value calculated by Equation 2 below may range approximately from 110 to approximately 230:

$$\left(\frac{R_{Cu}}{R_N}\right)^2 \times \frac{R_O}{100}.\qquad\text{[Equation 2]}$$

In the method of fabricating a semiconductor device according to one embodiment, a value calculated by Equation 3 below may range from 0.9 to 1:

$$\frac{R_O}{R_{Cu}}.\qquad\text{[Equation 3]}$$

In the method of fabricating a semiconductor device according to one embodiment, a polishing rate ($R_O$) for the silicon oxide film may range from approximately 1,000 Å/min to approximately 5,000 Å/min, a polishing rate ($R_N$) for the silicon nitride film may range from approximately 400 Å/min to approximately 3,000 Å/min, and a polishing rate ($R_{Cu}$) for the copper electrode may range from approximately 1,000 Å/min to approximately 5,000 Å/min.

In the method of fabricating a semiconductor device according to one embodiment, after the polishing, a height difference between a polishing surface of the copper electrode and a polishing surface of the silicon nitride film may be less than approximately 5 nm.

In the method of fabricating a semiconductor device according to one embodiment, after the polishing, a height difference between the polishing surface of the copper electrode and a polishing surface of the silicon oxide film may be less than approximately 20 nm.

In the method of fabricating a semiconductor device according to one embodiment, the additive may include one selected from the group consisting of an azole-based compound, a phosphoric acid-based compound, a fluorine-based compound, an organic acid, and a combination thereof.

In the method of fabricating a semiconductor device according to one embodiment, for the abrasive grains, a value obtained by dividing D90 by D80 may be 1 to 1.5.

BRIEF DESCRIPTION OF THE DRAWINGS

The above and other attributes, features and other advantages of the present disclosure will be more clearly understood from the following detailed description taken in conjunction with the accompanying drawings, in which.

DETAILED DESCRIPTION OF THE DISCLOSURE

Figure 1:
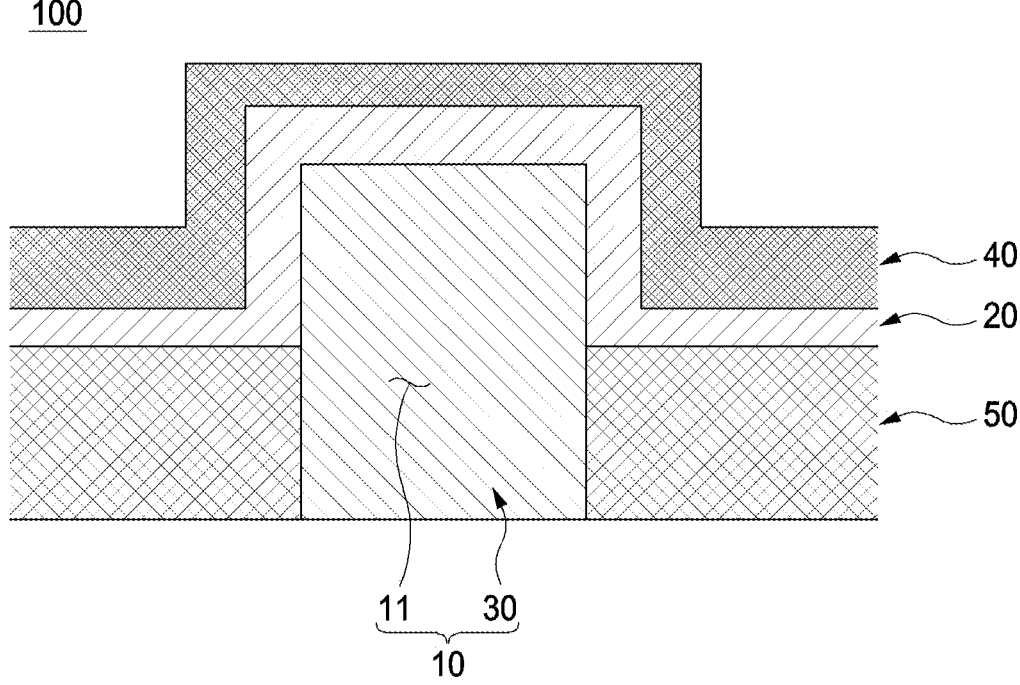
FIG. 1 schematically shows a cross-sectional view in the thickness direction before polishing a semiconductor wafer, which is a polishing target of a polishing composition for semiconductor processing according to one embodiment.

The present disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will convey the concept of the disclosure to those skilled in the art.

In the present disclosure, it is to be understood that, unless stated otherwise, when a part "comprises", "contains", or "has" any element, the part may further include other elements without excluding other elements.

In the present disclosure, in describing a numerical range, the description of "X to Y" means any one of the numerical ranges from X to Y including "X and Y". The present disclosure also includes any intervening ranges of the disclosed ranges.

In the drawings, when necessary, some configurations are shown enlarged to clearly express a layer or region. In addition, in the drawings, for convenience of description, the thicknesses of some layers and regions are exaggerated. Throughout the specification, like reference numerals denote like elements.

In addition, in the present disclosure, when an element such as a layer, a film, a region, and a plate is referred to as being "on" another element, the element can be directly on another element or an intervening element can be present. When an element is "directly on" another element, it is interpreted that there is no intervening element. In addition, when an element such as a layer, a film, a region, and a plate is referred to as being "below" another element, the element can be directly below another element or an intervening element can be present. When an element is "directly below" another element, it is interpreted that there is no intervening element.

Hereinafter, embodiments according to the present disclosure will be described in detail.

The present disclosure has been made in view of improving precision in the manufacture and design of process components, and provides a polishing composition for semiconductor processing being applicable to a semiconductor process including a process of polishing a semiconductor wafer, more specifically, a process of polishing a semiconductor wafer including a through-silicon via (TSV), being capable of implementing improved polishing performance, being capable of minimizing defects such as dishing, erosion, and protrusion, and being capable of realizing an evenly polished surface without deviation between films when polishing a surface where a plurality of different films are exposed to the outside.

In one embodiment, the present disclosure provides a method of fabricating a semiconductor device including polishing a semiconductor wafer through which a TSV is formed using the polishing composition for semiconductor processing and being capable of minimizing defect rate so that memory chip functions are implemented without errors or defects in a plurality of laminated chips connected by the TSV.

More specifically, in one embodiment of the present disclosure, there is provided a polishing composition for semiconductor processing including abrasive grains; and at least one additive, wherein the polishing composition has an etching ratio correlation value ranging from approximately 1.45 to approximately 1.90 as calculated by Equation 1 below:

$$\frac{R_O^2}{(R_{Cu} \times R_N)}. \qquad \text{[Equation 1]}$$

In Equation 1, $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film.

At this time, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

As integration of semiconductor devices has advanced, packaging technology that connects the upper and lower chips with an electrode by forming a fine via through the chips and forming an electrode in the via, unlike the conventional method of connecting chips using wires, has developed. In the present disclosure, such a via may be referred to as a through-silicon via (TSV). TSV technology realizes a high-capacity semiconductor device by laminating a plurality of chips and electrically connecting the chips. The TSV technology has advantages in terms of speed and power consumption compared to wire bonding technology that connects chips using wires. However, sophisticated processing technology is required to form a fine via through a semiconductor wafer and fill the via with an electrode material. Structurally, the TSV is often a result of combination of a) a silicon oxide film occupying the main area of a semiconductor wafer, b) copper, which is mainly used as an electrode material to be charged in a via, and c) silicon nitride as a barrier between the silicon oxide film and the copper electrode. In the case of wafers that contain a TSV, a process of simultaneously polishing various film materials with minimal defect generation affects the ability to connect the upper and lower chips. In this process, to polish different film materials to have substantially the same flatness, the physical and/or chemical function of the polishing composition for semiconductor processing used in the process specifically is designed according to the embodiments disclosed herein.

Since the etch rate ration correlation value calculated by Equation 1 (above) (hereinafter referred to as a correlation value) expressing the correlation between the polishing rates (Å/min) of the polishing composition for semiconductor processing according to one embodiment measured for a silicon oxide film, a copper film, and a silicon nitride film under specific conditions is within a predetermined range, when the polishing composition for semiconductor processing is used, the surface of a semiconductor wafer including a TSV may be polished evenly without defects. More specifically, in one embodiment, at a boundary of a discontinuous structure of a surface to be polished, such as the TSV, occurrence of defects such as excessive dishing or excessive protrusion due to over polishing of either side may be prevented when the above noted ranges for the correlation value are met.

Equation 1 defines the ratio of a) the square of the polishing rate for the silicon oxide film to b) a value obtained by multiplying the polishing rate for the silicon nitride film by the polishing rate for the copper film. Compared to a conventional polishing selection ratio defined as a "one-dimensional" ratio of the polishing rates for each of the silicon oxide film, the copper film, and/or the silicon nitride film, the present invention has discovered that, in terms of predicting polishing results that do not cause defects such as dishing, protrusion, erosion, and peaking, Equation 1 may function as a technical guide to achieve significantly improved correlation(s). That is, even when the one-dimensional polishing selection ratio for each film, for example, the polishing rate ratio of silicon oxide film:copper film or the polishing rate ratio of silicon nitride film:copper film satisfies a predetermined range, the actual polishing performance of a semiconductor wafer including a TSV could not achieve the target level in some cases. On the other hand, the polishing composition for semiconductor processing that satisfies the correlation value of Equation 1 within a predetermined range exhibits a correlation that realizes performance without errors in achieving a target level of polishing performance for a semiconductor wafer through which a TSV is formed.

Figure 5:
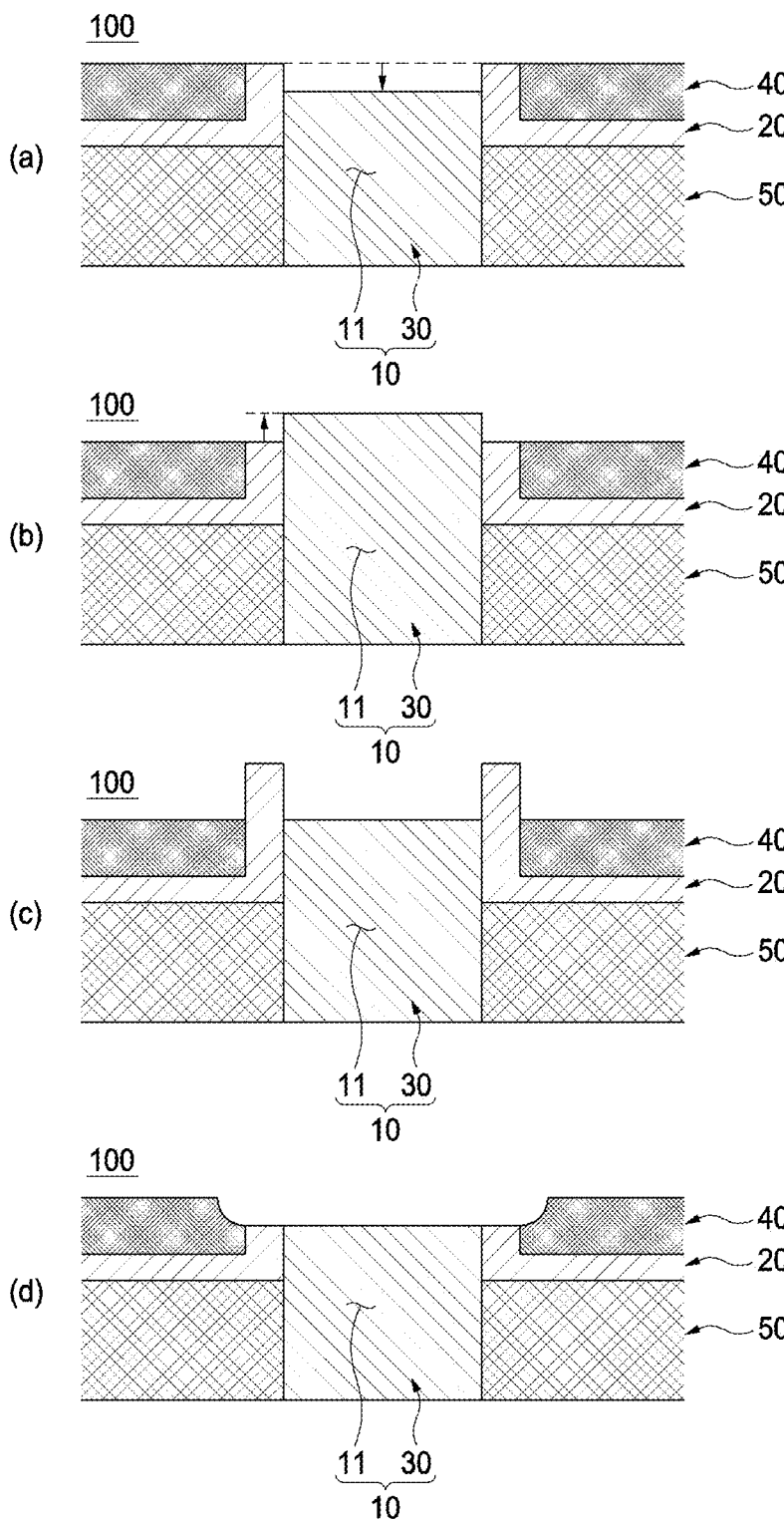
FIG. 5 schematically shows exemplary defects that may occur during polishing of a semiconductor wafer, which is a polishing target of a polishing composition for semiconductor processing according to another embodiment.

FIG. 5 schematically shows some examples of defects that may occur during polishing of a semiconductor wafer, which is a polishing target of the polishing composition for semiconductor processing according to one embodiment. Specifically, FIG. 5 schematically shows some examples of defects that may occur during polishing of a semiconductor wafer 100 having a through-silicon via 10. More specifically, FIG. 5A is an example of dishing, showing an example of a defect that the copper film 30 is more polished than other films. FIG. 5B is an example of protrusion, showing an example of a defect that the copper film 30 is less polished than other films. FIG. 5C is an example of peaking, showing an example of a defect that the silicon nitride film 20 is higher than other films. FIG. 5D is an example of erosion, showing an example of a defect that the through-silicon via (TSV) and the copper film, where the silicon nitride film 20, and the silicon oxide film 40 nearer the peripheral region of the TSV is excessively removed compared to the surrounding silicon oxide film 40. Since the polishing composition for semiconductor processing satisfies the correlation value of Equation 1 within a predetermined range, in achieving polishing performance for the semiconductor wafer on which the TSV is formed to a target level, as shown in FIG. 5, in terms of preventing defects, correlation that may implement performance practically without errors is shown.

Specifically, the polishing composition for semiconductor processing may have a correlation value of Equation 1 ranging from approximately 1.45 to approximately 1.90, for example, ranging from approximately 1.45 to approximately 1.80, for example, ranging from approximately 1.45 to approximately 1.70, for example, ranging from approximately 1.50 to approximately 1.90, for example, ranging from approximately 1.50 to approximately 1.90, for example, ranging from approximately 1.50 to approximately 1.80, for example, ranging from approximately 1.50 to approximately 1.70. When the correlation value of Equation 1 is too low or too high, at the boundaries of discontinuous structures of various films related to the TSV, one side may be over-polished, resulting in dishing or protrusion. Alternatively, peaking may occur in which the silicon nitride film, which is a barrier film, is higher than the copper electrode and the silicon oxide film, or erosion may occur in which the barrier film including the copper electrode and the silicon nitride is over-polished compared to the silicon oxide film. The TSV structure occupies a relatively small area compared to the total area of the semiconductor wafer. Occurrence of such defects may also be determined by a slight difference in the correlation value of Equation 1, for example, approximately ±0.01 difference.

In one embodiment, the polishing composition for semiconductor processing may have a value ranging from approximately 110.0 to approximately 230.0 as calculated by Equation 2 below:

$$\left(\frac{R_{Cu}}{R_N}\right)^2 \times \frac{R_O}{100}. \qquad \text{[Equation 2]}$$

In Equation 2, $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film.

In addition, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

When the polishing composition for semiconductor processing is used, in one embodiment, the correlation value of Equation 1 is within the above-described range, and the value of Equation 2 is within a range of approximately 110.0 to approximately 230.0. Accordingly, in one embodiment, the surface of a semiconductor wafer including a TSV may be evenly polished without defects. Specifically, at the boundary of a discontinuous structure of a surface to be polished, such as one or more the boundaries between different materials in the TSV, the occurrence of defects such as excessive dishing or excessive protrusion due to over polishing of either side may be prevented.

Specifically, the polishing composition for semiconductor processing may have a value of Equation 2, for example, ranging from approximately 110.0 to approximately 230.0, for example, ranging from approximately 110.0 to approximately 200.0, for example, ranging from approximately 110.0 to approximately 190.0, for example, ranging from approximately 110.0 to approximately 180.0, for example, ranging from approximately 110.0 to approximately 170.0, for example, ranging from approximately 110.0 to approximately 160.0, for example, ranging from approximately 110.0 to approximately 150.0, for example, ranging from approximately 110.0 to approximately 140.0, for example, ranging from approximately 115.0 to approximately 135.0. As the value of Equation 2 satisfies this range, in polishing of a semiconductor wafer having a structure including a through-silicon via (TSV) with a predetermined area out of the total area, the effect of evenly polishing various films by the through-silicon via (TSV) at the same time may be improved.

In one embodiment, the polishing composition for semiconductor processing may have a value of Equation 3 below ranging from approximately 0.90 to approximately 1.00:

$$\frac{R_O}{R_{Cu}}. \qquad \text{[Equation 3]}$$

In Equation 3, $R_O$ represents a polishing rate (Å/min) of the polishing composition for semiconductor processing for a silicon oxide film, and $R_{Cu}$ represents a polishing rate (Å/min) of the polishing composition for semiconductor processing for a copper film. When $R_O$ and $R_{Cu}$ are measured, 100 parts by weight of the polishing composition for semiconductor processing and 0.25 parts by weight of hydrogen peroxide are mixed to obtain a mixture, polishing is performed for 60 seconds while applying the mixture containing the polishing composition at a flow rate of 300 mL/min onto a wafer having the silicon oxide film and a wafer having the copper film under conditions of a carrier pressurization of 3.0 psi, a carrier rotation speed of 120 rpm, and a surface plate rotation speed of 117 rpm, and then $R_O$ and $R_{Cu}$ are measured.

Specifically, the polishing composition for semiconductor processing may have a value of Equation 3, for example, ranging from approximately 0.90 to approximately 1.00, for example, ranging from approximately 0.90 or more, less than approximately 1.00, for example, ranging from approximately 0.90 to approximately 0.99, for example, ranging from approximately 0.91 to approximately 0.99, for example, ranging from approximately 0.92 to approximately 0.99, for example, ranging from approximately 0.93 to approximately 0.99, for example, ranging from approximately 0.94 to approximately 0.99, for example, ranging from approximately 0.95 to approximately 0.99. The through-silicon via (TSV) occupies a relatively small area compared to the entire area of the semiconductor wafer. Whether defects such as dishing, protrusion, erosion, and/or peaking occur may be determined even by a slight difference in the value of Equation 3, for example, approximately ±0.01 difference. From this point of view, the polishing composition for semiconductor processing is designed so that the polishing rate ($R_{Cu}$) for the copper film is slightly higher than or equal to the polishing rate ($R_O$) for the silicon oxide film. Accordingly, in a semiconductor wafer including the through-silicon via (TSV) at a predetermined area ratio, the copper electrode portion of the through-silicon via (TSV) and the silicon oxide film portion occupying most of the total area of the semiconductor wafer may be polished uniformly at the same time. More specifically, when the polishing rate ($R_{Cu}$) of the polishing composition for semiconductor processing for the copper film is designed to be slightly higher than the polishing rate ($R_O$) for the silicon oxide film, this technical effect may be further improved.

In one embodiment, when the polishing composition for semiconductor processing is used, the values obtained by Equations 1, 2, and 3 can simultaneously satisfy the aforementioned respective ranges. Accordingly, in a semiconductor wafer including the through-silicon via (TSV) at a predetermined area ratio, the boundaries of various discontinuous films due to the through-silicon via (TSV) may be simultaneously and uniformly polished without defects such as dishing, protrusion, erosion, and/or peaking.

In one embodiment, the polishing composition for semiconductor processing may have a value of Equation 4 below ranging from approximately 1.55 to approximately 2.40:

$$\frac{R_{Cu}}{R_N}. \qquad \text{[Equation 4]}$$

In Equation 4, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film. When $R_N$ and $R_{Cu}$ are measured, 100 parts by weight of the polishing composition for semiconductor processing and 0.25 parts by weight of hydrogen peroxide are mixed to obtain a mixture, polishing is performed for 60 seconds while applying the mixture containing the polishing composition at a flow rate of 300 mL/min onto a wafer having the silicon nitride film and a wafer having the copper film under conditions of a carrier pressurization of 3.0 psi, a carrier rotation speed of 120 rpm, and a surface plate rotation speed of 117 rpm, and then $R_N$ and $R_{Cu}$ are measured.

Specifically, the polishing composition for semiconductor processing may have a value of Equation 4, for example, ranging from approximately 1.55 to approximately 2.40, for example, ranging from approximately 1.55 to approximately 2.30, for example, ranging from approximately 1.55 to approximately 2.20, for example, ranging from approximately 1.55 to approximately 2.10, for example, ranging from approximately 1.55 to 2.00, for example, ranging from approximately 1.55 to 1.95, for example, ranging from approximately 1.55 to approximately 1.90, for example, ranging from approximately 1.55 to approximately 1.85, for example, ranging from 1.60 to approximately 2.40, for example, ranging from approximately 1.60 to approximately 2.30, for example, ranging from approximately 1.60 to approximately 2.20, for example, ranging from approximately 1.60 to approximately 2.10, for example, ranging from approximately 1.60 to 2.00, for example, ranging from approximately 1.60 to 1.95, for example, ranging from approximately 1.60 to approximately 1.90, for example, ranging from approximately 1.60 to approximately 1.85, for example, ranging from approximately 1.65 to approximately 1.85. The through-silicon via (TSV) occupies a relatively small area compared to the entire area of the semiconductor wafer. Whether defects such as dishing, protrusion, erosion, and/or peaking occur may be determined even by a slight difference in the value of Equation 4, for example, approximately ±0.01 difference. From this point of view, the polishing composition for semiconductor processing is designed so that the polishing rate ($R_{Cu}$) for the copper film and the polishing rate ($R_N$) for the silicon nitride film satisfy the above-described ratio(s). Accordingly, in a semiconductor wafer including the through-silicon via (TSV) at a predetermined area ratio, the copper electrode portion of the through-silicon via (TSV) and the silicon nitride film surrounding the copper electrode portion, which functions as a barrier film, may be polished uniformly at the same time.

In one embodiment, when the polishing composition for semiconductor processing is used, all values obtained by Equations 1, 2, and 4 can simultaneously satisfy the respective ranges. Accordingly, in a semiconductor wafer including the through-silicon via (TSV) at a predetermined area ratio, the boundaries of various discontinuous films due to the through-silicon via (TSV) may be simultaneously and uniformly polished without defects such as dishing, protrusion, erosion, and/or peaking. In addition, when the polishing composition for semiconductor processing is used and when the values obtained by Equations 1, 2, 3, and 4 simultaneously satisfy the respective ranges, this technical effect may be maximized.

In the polishing composition for semiconductor processing according to one embodiment, a polishing rate ($R_O$) for the silicon oxide film may, for example, range from approximately 1,000 Å/min to approximately 5,000 Å/min, for example, range from approximately 1,500 Å/min to approximately 5,000 Å/min, for example, range from approximately 2,000 Å/min to approximately 5,000 Å/min, for example, range from approximately 2,500 Å/min, to approximately 5,000 Å/min, for example, range from approximately 3,000 Å/min to approximately 5,000 Å/min, for example, range from approximately 3,500 Å/min to approximately 5,000 Å/min, for example, range from approximately 4,000 Å/min to approximately 5,000 Å/min, for example, range from approximately 4,000 Å/min to approximately 4,500 Å/min. When $R_O$ is measured, 100 parts by weight of the polishing composition for semiconductor processing and 0.25 parts by weight of hydrogen peroxide are mixed to obtain a mixture, polishing is performed for 60 seconds while applying the mixture containing the polishing composition at a flow rate of 300 mL/min onto a semiconductor wafer having the silicon oxide film under conditions of a carrier pressurization of 3.0 psi, a carrier rotation speed of 120 rpm, and a surface plate rotation speed of 117 rpm, and then $R_O$ is measured. These polishing composition(s) for semiconductor processing may improve the overall process efficiency by realizing the polishing rate for the silicon oxide film that occupies a major portion of the total area of the semiconductor wafer, and defects such as erosion may be prevented when simultaneously polishing discontinuous films related to the through-silicon via (TSV).

In the polishing composition for semiconductor processing according to one embodiment, a polishing rate ($R_N$) for the silicon nitride film may for example, range from approximately 400 Å/min to approximately 3,000 Å/min, for example, range from approximately 450 Å/min to approximately 2,800 Å/min, for example, range from approximately 1,500 Å/min to approximately 3,000 Å/min, for example, range from approximately 1,600 Å/min to approximately 3,000 Å/min, for example, range from approximately 1,800 Å/min to approximately 3,000 Å/min, for example, range from approximately 1,900 Å/min to approximately 3,000 Å/min, for example, range from approximately 2,000 Å/min to approximately 3,000, for example, range from approximately 2,000 Å/min to approximately 2,800 Å/min, for example, range from approximately 2,200 Å/min to approximately 2,800 Å/min. When $R_N$ is measured, 100 parts by weight of the polishing composition for semiconductor processing and 0.25 parts by weight of hydrogen peroxide are mixed to obtain a mixture, polishing is performed for 60 seconds while applying the mixture containing the polishing composition at a flow rate of 300 mL/min onto a semiconductor wafer having the silicon oxide film under conditions of a carrier pressurization of 3.0 psi, a carrier rotation speed of 120 rpm, and a surface plate rotation speed of 117 rpm, and then $R_N$ is measured. In this case, these polishing composition(s) for semiconductor processing implements the polishing rate for the silicon nitride film that functions as a barrier film surrounding the edge of the through-silicon via (TSV). Accordingly, a silicon nitride film peaking defect caused by other films around the silicon nitride film being over-polished compared to the silicon nitride film may be effectively prevented.

In the polishing composition for semiconductor processing according to one embodiment, a polishing rate ($R_{Cu}$) for the copper film may for example, range from approximately 1,000 Å/min to approximately 5,000 Å/min, for example, range from approximately 1,500 Å/min to approximately 5,000 Å/min, for example, range from approximately 2,000 Å/min to approximately 5,000 Å/min, for example, range from approximately 2,500 Å/min to approximately 5,000 Å/min, for example, range from approximately 3,000 Å/min to approximately 5,000 Å/min, for example, range from approximately 3,500 Å/min to approximately 5,000 Å/min, for example, range from approximately 4,000 Å/min to approximately 5,000 Å/min, for example, range from approximately 4,000 Å/min to approximately 4,500 Å/min. When $R_{Cu}$ is measured, 100 parts by weight of the polishing composition for semiconductor processing and 0.25 parts by weight of hydrogen peroxide are mixed to obtain a mixture, polishing is performed for 60 seconds while applying the mixture containing the polishing composition at a flow rate of 300 mL/min onto a semiconductor wafer having the silicon oxide film under conditions of a carrier pressurization of 3.0 psi, a carrier rotation speed of 120 rpm, and a surface plate rotation speed of 117 rpm, and then $R_{Cu}$ is measured. These polishing composition(s) for semiconductor processing exhibits a polishing rate for copper used as an electrode material filling the through-silicon via (TSV). Accordingly, a defect such as dishing caused by over polishing of the copper film or protrusion caused by the copper film not being polished to the desired level may be prevented.

Figure 2:
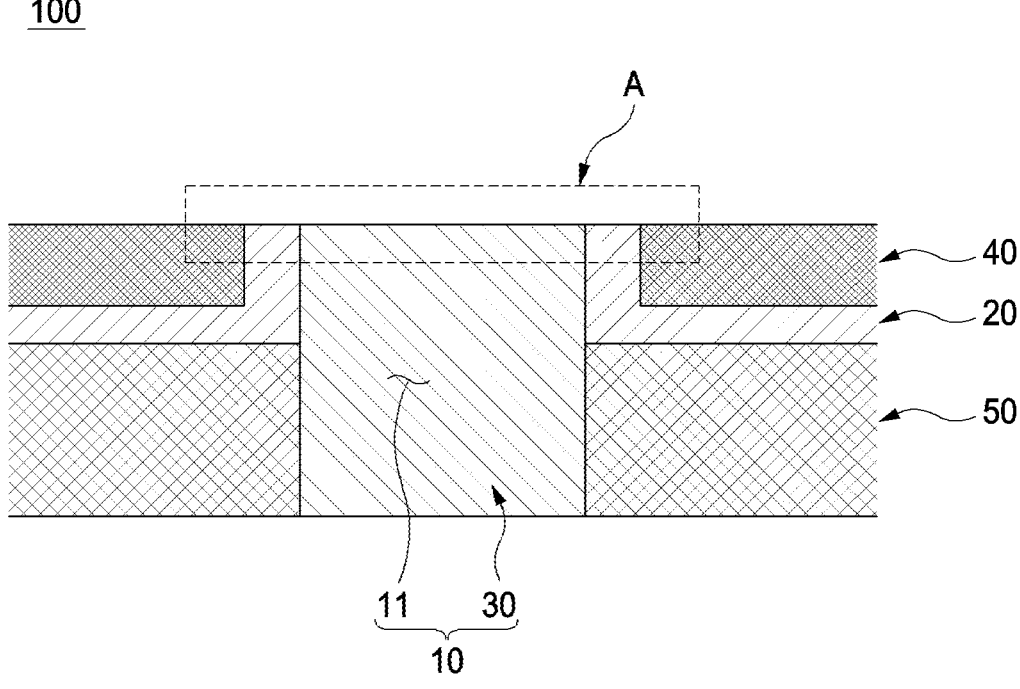
FIG. 2 schematically shows a cross-sectional view in the thickness direction after polishing a semiconductor wafer, which is a polishing target of a polishing composition for semiconductor processing according to another embodiment.
Figure 3:
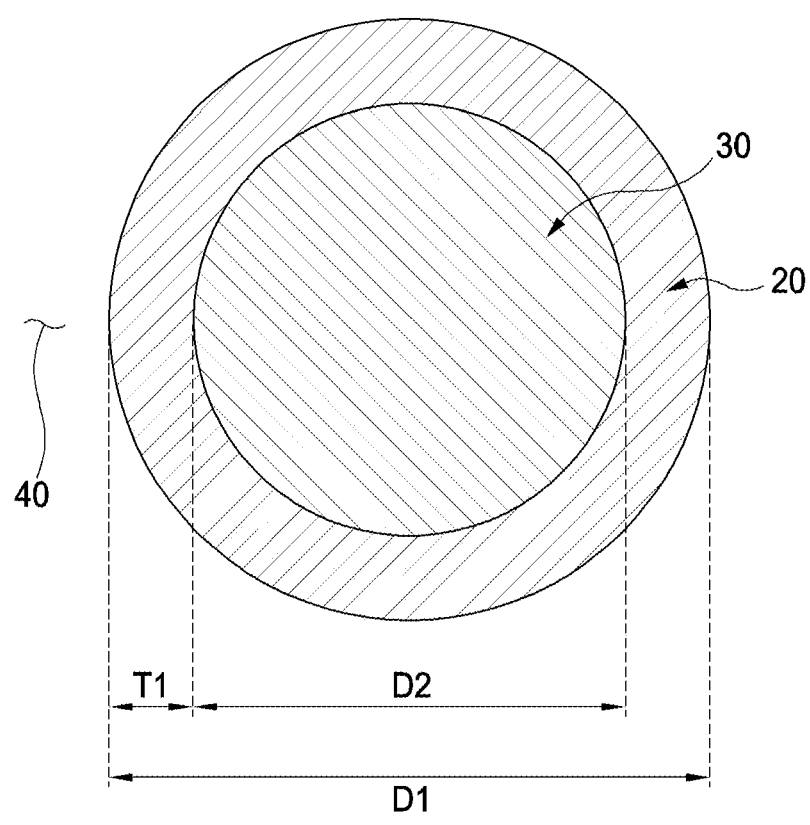
FIG. 3 is a schematic top view of part A of FIG. 2.

As described above, the polishing composition for semiconductor processing may be applied to polish the surface of a semiconductor wafer having the through-silicon via (TSV). FIG. 1 schematically shows a cross-sectional view in the thickness direction before polishing the semiconductor wafer 100, which is a polishing target of the polishing composition for semiconductor processing according to one embodiment. FIG. 2 schematically shows a cross-sectional view in the thickness direction after polishing the semiconductor wafer 100. FIG. 3 is a schematic top view of part A of FIG. 2.

Referring to FIGS. 1 to 3, the semiconductor wafer 100 may include a substrate 50 and a silicon nitride film 20 and a silicon oxide film 40 disposed on the substrate 50. In addition, the semiconductor wafer 100 may include the through-silicon via 10, and the through-silicon via 10 may include a via 11 penetrating the substrate 50 and a copper electrode 30 charged inside the via 11. In one embodiment, the substrate 50 may include silicon (Si).

Referring to FIGS. 1 and 2, in the polishing process during the process of fabricating a semiconductor device, each film of wafer 100 is polished from the uppermost surface of wafer 100. As shown in FIG. 2, after polishing, the wafer 100 has a structure in which the silicon oxide film 40, the silicon nitride film 20, and the copper electrode 30 are all exposed on the top surface. In the process of fabricating a semiconductor device, after a predetermined time elapses after polishing starts, different types of films are exposed on the uppermost surface of the wafer, that is, the surface being polished. Since different types of films are simultaneously polished under an environment with the same physical polishing conditions, such as the rotation speed of the carrier, the rotation speed of the polishing pad, and the pressure condition of the carrier, to evenly polish these films, the chemical action(s) of the polishing composition for semiconductor processing may impact the uniformity of the resultant polished surface.

When the polishing composition for semiconductor processing is used, values obtained by Equation 1, Equation 2, Equation 3, and/or Equation 4 may satisfy the aforementioned ranges. Accordingly, in one embodiment, polishing may be performed so that different layers on the wafer 100 have substantially the same flatness by the through-silicon via 10. In particular, in polishing of the semiconductor wafer 100 having a structure in which the area of the through-silicon via 10 and the silicon nitride film 20 has a predetermined area ratio to the total area of the semiconductor wafer 100, the numerical ranges of Equation 1, Equation 2, Equation 3, and/or Equation 4 may be more advantageous in terms of showing a correlation corresponding to the effect of implementing defect-free polishing flatness.

Referring to FIGS. 2 and 3, the silicon nitride film 20 has a structure in which a part thereof surrounds the periphery of the copper electrode 30, and this part may function as an insulating film and a barrier film. Specifically, the silicon nitride film 20 may perform a function of preventing diffusion of copper atoms from the copper electrode 30 to the substrate 50.

Referring to FIG. 3, in one embodiment, the ratio (D2/D1) of the diameter (D2) of the copper electrode 30 to the total diameter (D1) of the copper electrode 30 and the silicon nitride film 20 surrounding the copper electrode 30 may for example range from approximately 0.5 to approximately 1.0, for example, range from approximately 0.7 to approximately 1.0, for example, range from approximately 0.5 to less than approximately 1.0, for example, range from approximately 0.7 to less than approximately 1.0. When the polishing composition for semiconductor processing is applied to the semiconductor wafer having the pattern structure described above, which is a polishing target, and when the values of the polishing composition for semiconductor processing obtained by Equation 1, Equation 2, Equation 3, and/or Equation 4 satisfy the above-described ranges, the effect(s) of preventing excessive dishing or protrusion of the copper electrode 30 and a correlation indicative of the polishing result may be obtained.

In one embodiment, the ratio (2T1/D1) of the thickness (T1) of the silicon nitride film 20 to the total diameter (D1) of the copper electrode 30 and the silicon nitride film 20 surrounding the copper electrode 30 may for example range from approximately 0.1 to approximately 0.5, for example, range from approximately 0.1 to approximately 0.3. When the semiconductor wafer having the pattern structure described above is used as a polishing target, and when the values of the polishing composition for semiconductor processing obtained by Equation 1, Equation 2, Equation 3, and/or Equation 4 satisfy the above-described ranges, the effect(s) of preventing peaking of the silicon nitride film 20 and/or a correlation indicative of the polishing result may be obtained.

The polishing composition for semiconductor processing may include abrasive grains and at least one additive. To ensure that the values of Equation 1, Equation 2, Equation 3, and/or Equation 4 of the polishing composition(s) for semiconductor processing are within the ranges noted above, below are comprehensive results obtained by specifically designing the polishing composition and content of the abrasive grains and the additive, as detailed below.

In one embodiment, the abrasive grains may include inorganic particles, organic particles, or organic/inorganic composite particles. In the present disclosure, "inorganic particles" and "organic particles" refer to particles mainly composed of an inorganic component and particles mainly composed of an organic component, respectively. Even when each contains a trace amount of a heterogeneous component, i.e., even when the inorganic particles contain a trace amount of an organic ingredient or even when the organic particles contain a trace amount of an inorganic ingredient, the above definition may also be applied. In this case, "trace amount" means a content of approximately 0.005% by weight to approximately 0.03% by weight based on 100% by weight in total of the abrasive grains. In the present disclosure, "organic/inorganic composite particles" means particles containing organic and inorganic components, and at this time, one of the two components is included in an amount of 50% by weight to 90% by weight.

In one embodiment, the abrasive grains may include inorganic particles. For example, the inorganic particles may include one or more selected from the group consisting of silica ($SiO_2$), ceria ($CeO_2$), alumina ($Al_2O_3$), zirconia ($ZrO_2$), and a combination thereof. By including inorganic particles in the abrasive grains, chemical compatibility with the additive may be adjusted in application of the polishing composition for semiconductor processing, and thus side effects caused by sudden change in polishing performance may be minimized.

In one embodiment, the abrasive grains may be in a colloidal state. For example, the abrasive grains may include colloidal inorganic particles.

The hydrogen ion concentration (pH) of the polishing composition for semiconductor processing may range for example from approximately 2 to approximately 5, for example, range from approximately 3 or more, range from approximately 5 or less, for example, range from approximately 3 to less than approximately 5.

A zeta potential value of the abrasive grains in the polishing composition for semiconductor processing may be a positive (+) value. Specifically, the abrasive grains in the polishing composition for semiconductor processing may include inorganic particles and have a positive (+) zeta potential value. The zeta potential value of the abrasive grains in the polishing composition for semiconductor processing may range from approximately +5 mV to approximately +50 mV, for example, range from approximately +10 mV to approximately +40 mV, for example, range from approximately +10 mV to approximately +30 mV, for example, range from approximately 18 mV to approximately 40 mV. Methods of measuring the zeta potential of the abrasive grains in the polishing composition for semiconductor processing are not particularly limited. For example, after putting approximately 1 mL of the polishing composition for semiconductor processing into a measuring cell, the zeta potential thereof is measured using a zeta potential measurement device (Zeta-sizer Nano ZS, Malvern Co.). For example, the zeta potential value may be an average value taken from approximately 100 measurements.

When the hydrogen ion concentration (pH) of the polishing composition for semiconductor processing satisfies the above-described range and at the same time, the zeta potential value of the abrasive grains in the polishing composition for semiconductor processing satisfies the above-described range, polishing characteristics for semiconductor wafers may be optimally designed. Specifically, the abrasive grains may be adsorbed to the surface of the semiconductor wafer to be polished at a predetermined level or higher, and at the same time, the abrasive grains may be separated at a predetermined level or higher. When the abrasive grains are adsorbed to the surface of the semiconductor wafer to be polished with an "excessive" adsorption force (in which separation thereof is not easy), defects such as scratches may occur on the surface to be polished. Conversely, when the abrasive grains are not adsorbed to the surface to be polished with a requisite attractive force and have excessive fluidity, due to decrease in physical friction, the polishing rate may not be achieved to a target level. Accordingly, when the hydrogen ion concentration (pH) of the polishing composition for semiconductor processing satisfies the above-described range and at the same time, the zeta potential value of the abrasive grains in the polishing composition for semiconductor processing satisfies the above-described range, the abrasive grains may be adsorbed to the surface of the semiconductor wafer to be polished with an appropriate level of adsorption, and at the same time, the abrasive grains may be separated from the surface to be polished. Accordingly, a target level of polishing rate may be secured, and defects may be minimized, providing a significant polishing result when the surface to which the polishing composition for semiconductor processing is applied includes a silicon nitride film and a copper film. In particular, the technical effect may be further maximized when polishing a surface including a silicon oxide film.

In one embodiment, the abrasive grains may include surface-treated particles so that the abrasive grains of the polishing composition for semiconductor processing have a positive (+) zeta potential value. Specifically, the abrasive grains may include inorganic particles, and the inorganic particles may include particles surface-treated with at least one organic component.

Based on 100 parts by weight of the inorganic particles, the amount of at least one organic component applied for surface treatment of the inorganic particles may, for example, range from approximately 0.005 parts by weight to approximately 0.05 parts by weight, for example, range from approximately 0.005 parts by weight to approximately 0.04 parts by weight, for example, range from approximately 0.005 parts by weight to approximately 0.030 parts by weight, for example, range from approximately 0.005 parts by weight to approximately 0.020 parts by weight, for example, range from approximately 0.005 parts by weight or more, less than approximately 0.020 parts by weight, for example, range from approximately 0.005 parts by weight to approximately 0.015 parts by weight, for example, range from approximately 0.005 parts by weight to approximately 0.010 parts by weight, for example, range from approximately 0.005 parts by weight or more to less than approximately 0.010 parts by weight. From another point of view, when the surface modification rate is defined as 100% when the amount of at least one organic component applied for surface treatment of the inorganic particles is 0.010 parts by weight based on 100 parts by weight of the inorganic particles, the surface modification rate of the inorganic particles may for example range from approximately 50% to approximately 500%, for example, range from approximately 50% to approximately 400%, for example, range from approximately 50% to approximately 300%, for example, range from approximately 50% to approximately 200%, for example, range from approximately 50% or more, less than approximately 200%, for example, range from approximately 50% to approximately 150%, for example, range from approximately 50% to approximately 100%, for example, range from approximately 50% or more to less than approximately 100%. As the surface treatment level of the inorganic particles satisfies this range, the abrasive action of the abrasive grains may ensure that the values of Equation 1, Equation 2, Equation 3, and/or Equation 4 satisfy the above-noted respective ranges. As a result, a flatness may be realized in simultaneous polishing of different types of films, and at the same time, and surface defects such as scratches may be effectively prevented. In addition, when surface treatment of the inorganic particles is excessive, the side effects caused by the abrasive grains remaining as surplus materials may be effectively prevented.

For example, the organic component for surface treatment of the inorganic particles may include one or more selected from the group consisting of amino silane, alkoxy silane, ethoxy silane, epoxy silane, and a combination thereof.

In another embodiment, the abrasive grains may include particles with cation sites disposed therein so that the abrasive grains in the polishing composition for semiconductor processing have a positive (+) zeta potential value. Specifically, the abrasive grains may include inorganic particles, and the inorganic particles may include cation sites inside the particles. The cation sites may be placed inside the particle by reacting a particle base component and a cation site providing component during preparation of the inorganic particles.

For example, the cation site providing component may include one or more selected from the group consisting of amino silane, alkoxy silane, ethoxy silane, epoxy silane, and a combination thereof.

In one embodiment, the inorganic particles may include silica ($SiO_2$), and at least one organic component applied for surface treatment of the inorganic particles or the cation site providing component for providing cation sites inside a particle may include amino silane or ethoxy silane.

For example, in one embodiment. the organic component applied for surface treatment or the cation site providing component may include both amino silane and ethoxy silane. In this case, the mole ratio of amino silane to ethoxy silane may for example range from approximately 10:1 to approximately 5:1, for example, range from approximately 10:1 to approximately 6:1, for example, range from approximately 10:1 to approximately 7:1, for example, range from approximately 10:1 to approximately 8:1, for example, range from approximately 9.5:1 to approximately 8.5:1, for example, may be approximately 9:1.

In another embodiment, the abrasive grains may include organic/inorganic composite particles, and the organic/inorganic composite particles may be, for example, particles having a core-shell structure composed of a core containing a polymer and a shell containing an inorganic component disposed on the surface of the core.

In one embodiment, the polymer of the core of the organic/inorganic composite particles may include, for example, polymethylmethacrylate (PMMA), polystyrene (PS), and the like. The inorganic component of the shell may include, for example, silica ($SiO_2$), ceria ($CeO_2$), alumina ($Al_2O_3$), titania ($TiO_2$), zirconia ($ZrO_2$), germanium dioxide ($GeO_2$), and the like.

For example, the abrasive grains may have an average particle diameter (D50) for example ranging from approximately 5 nm to approximately 150 nm, for example, ranging from approximately 5 nm to approximately 100 nm, for example, ranging from approximately 5 nm to approximately 80 nm, for example, ranging from approximately 10 nm to approximately 80 nm, for example, ranging from approximately 30 nm to approximately 50 nm, for example, ranging from approximately 35 nm to approximately 50 nm, for example, ranging from approximately 40 nm to approximately 50 nm, for example, ranging from approximately 42 nm to approximately 48 nm. By applying the abrasive grains having the above size, the chemical and physical etching function of the polishing composition for semiconductor processing is properly secured, so that the values of Equation 1, Equation 2, Equation 3, and/or Equation 4 satisfy the above-noted respective ranges.

In the particle distribution thereof, the abrasive grains may have a 10% cumulative mass particle size distribution diameter (D10), for example, ranging from approximately 5 nm to approximately 50 nm, for example, ranging from approximately 5 nm to approximately 35 nm, for example, ranging from approximately 10 nm to approximately 35 nm, for example, ranging from approximately 20 nm to approximately 35 nm, for example, ranging from approximately 23 nm to approximately 33 nm.

In the particle distribution thereof, the abrasive grains may have a 80% cumulative mass particle size distribution diameter (D80), for example, ranging from approximately 5 nm to approximately 60 nm, for example, ranging from approximately 10 nm to approximately 60 nm, for example, ranging from approximately 20 nm to approximately 60 nm, for example, ranging from approximately 25 nm to approximately 60 nm, for example, ranging from approximately 35 nm to approximately 60 nm, for example, ranging from approximately 40 nm to approximately 55 nm, for example, ranging from approximately 40 nm to approximately 50 nm.

In the particle distribution thereof, the abrasive grains may have a 90% cumulative mass particle size distribution diameter (D90), for example, ranging from approximately 40 nm to approximately 150 nm, for example, ranging from approximately 40 nm to approximately 100 nm, for example, ranging from approximately 45 nm to approximately 80 nm, for example, ranging from approximately 45 nm to approximately 65 nm, for example, ranging from 50 nm to approximately 60 nm.

In the particle distribution thereof, the abrasive grains may have a 10% cumulative mass particle size distribution diameter (D10), for example, ranging from approximately 23 nm to approximately 33 nm, may have a 50% cumulative mass particle size distribution diameter (D50) of approximately 40 nm to approximately 50 nm, and may have a 90% cumulative mass particle size distribution diameter (D90) ranging from approximately 50 nm to approximately 60 nm.

In the particle distribution thereof, the abrasive grains may satisfy a condition of $1.00 \leq D90/D80 \leq 1.50$, for example, $1.50 \leq D90/D10 \leq 2.70$, for example, $1.20 \leq D80/D10 \leq 2.20$. By applying abrasive grains having such a particle distribution, the polishing composition for semiconductor processing may satisfy the value of Equation 1 in a predetermined range, and thus improved polishing results may be obtained.

A method of measuring the particle size distribution of the abrasive grains is not particularly limited. For example, the particle size distribution of the abrasive grains may be measured using any general-purpose equipment used for particle size analysis of nano (nm)-scale particle powder in the art.

In one embodiment, based on a total weight of the polishing composition for semiconductor processing, the polishing composition for semiconductor processing may include the abrasive grains in an amount for example ranging from approximately 0.5% by weight to approximately 5.0% by weight, for example, ranging from approximately 0.5% by weight to approximately 4.5% by weight, for example, ranging from approximately 0.5% by weight to approximately 4.0% by weight, for example, ranging from approximately 0.5% by weight to approximately 3.5% by weight, for example, ranging from approximately 1.0% by weight to approximately 5.0% by weight, for example, ranging from approximately 1.5% by weight to approximately 5.0% by weight, for example, ranging from approximately 2.0% by weight to approximately 5.0% by weight, for example, ranging from approximately 2.5% by weight to approximately 5.0% by weight, for example, ranging from approximately 1.0% by weight to approximately 4.5% by weight, for example, ranging from approximately 1.5% by weight to approximately 4.0% by weight, for example, ranging from approximately 2.0% by weight to approximately 4.0% by weight, for example, ranging from approximately 2.5% by weight to approximately 3.5% by weight. By including the abrasive grains in the above content range(s), the polishing composition for semiconductor processing may secure appropriate fluidity during the polishing process, and the physical etching action of the polishing composition may be more advantageous to implement a polishing rate to achieve the values of Equation 1, Equation 2, Equation 3, and/or Equation 4 in the above-noted respective ranges.

The polishing composition for semiconductor processing may include at least one additive. The additive may play a role in adjusting the surface state of a polishing target to optimal polishing results through a chemical reaction.

The additive may include an organic acid. The organic acid may play a role in controlling the hydrogen ion concentration (pH) of the polishing composition for semiconductor processing. For example, the organic acid may include one or more selected from the group consisting of acetic acid ($CH_3COOH$), formic acid, benzoic acid, nicotinic acid, picolinic acid, and a combination thereof.

In one embodiment, based on 100 parts by weight of the abrasive grains, the organic acid may be included in an amount for example ranging from approximately 0.50 parts by weight to approximately 10.00 parts by weight, for example, ranging from approximately 0.50 parts by weight to approximately 9.00 parts by weight, for example, ranging from approximately 0.50 parts by weight to approximately 8.00 parts by weight, for example, ranging from approximately 0.50 parts by weight to approximately 7.00 parts by weight, ranging from approximately 0.50 parts by weight to approximately 6.00 parts by weight, for example, ranging from approximately 0.50 parts by weight to approximately 5.00 parts by weight, for example, ranging from approximately 0.50 parts by weight to approximately 4.00 parts by weight, for example, ranging from approximately 0.50 parts by weight to approximately 3.50 parts by weight, for example, ranging from approximately 1.00 part by weight to approximately 10.00 parts by weight, for example, ranging from approximately 1.00 part by weight to approximately 10.00 parts by weight, for example, ranging from approximately 1.50 parts by weight to approximately 10.00 parts by weight, for example, ranging from approximately 1.00 part by weight to approximately 8.00 parts by weight, for example, ranging from approximately 1.00 part by weight to approximately 6.00 parts by weight, for example, ranging from approximately 1.50 parts by weight to approximately 5.00 parts by weight, for example, ranging from approximately 1.00 part by weight to approximately 3.50 parts by weight, for example, ranging from approximately 1.50 parts by weight to approximately 3.50 parts by weight, for example, ranging from approximately 1.60 parts by weight to approximately 3.00 parts by weight.

The additive may include an inorganic acid. The inorganic acid may play a role in controlling the hydrogen ion concentration (pH) of the polishing composition for semiconductor processing. For example, the inorganic acid may include one or more selected from the group consisting of hydrochloric acid (HCl), phosphoric acid ($H_3PO_4$), sulfuric acid ($H_2SO_4$), nitric acid ($HNO_3$), boric acid ($H_3BO_3$), carbonic acid ($H_2CO_3$), hydrofluoric acid (HF), hydrobromic acid (HBr), perchloric acid ($HClO_4$), hydroiodic acid (HI), and a combination thereof. More specifically, the inorganic acid may include one or more selected from the group consisting of phosphoric acid ($H_3PO_4$), nitric acid ($HNO_3$), and a combination thereof. When this kind of inorganic acid is applied, pH may be adjusted and occurrence(s) of aggregation may be prevented.

In one embodiment, based on 100 parts by weight of the abrasive grains, the inorganic acid may be included in an amount for example ranging from approximately 0.50 parts by weight to approximately 10.00 parts by weight, for example, ranging from approximately 0.50 parts by weight to approximately 9.00 parts by weight, for example, ranging from approximately 0.50 parts by weight to approximately 8.00 parts by weight, for example, ranging from approximately 0.50 parts by weight to approximately 7.00 parts by weight, for example, ranging from approximately 0.50 parts by weight to approximately 6.00 parts by weight, for example, ranging from approximately 0.50 parts by weight to approximately 5.00 parts by weight, for example, ranging from approximately 0.50 parts by weight to approximately 4.00 parts by weight, for example, ranging from approximately 0.50 parts by weight to approximately 3.50 parts by weight, for example, ranging from approximately 1.00 part by weight to approximately 10.00 parts by weight, for example, ranging from approximately 1.00 part by weight to approximately 10.00 parts by weight, for example, ranging from approximately 1.50 parts by weight to approximately 10.00 parts by weight, for example, ranging from approximately 1.00 part by weight to approximately 8.00 parts by weight, for example, ranging from approximately 1.00 part by weight to approximately 6.00 parts by weight, for example, ranging from approximately 1.50 parts by weight to approximately 5.00 parts by weight, for example, ranging from approximately 1.00 part by weight to approximately 3.50 parts by weight, for example, ranging from approximately 1.50 parts by weight to approximately 3.50 parts by weight, for example, ranging from approximately 1.60 parts by weight to approximately 3.00 parts by weight.

The additive may include an azole-based compound. The azole-based compound may mainly play a role in controlling the surface properties of the copper film. For example, the azole-based compound may include one or more selected from the group consisting of imidazole, 5-aminotetrazole, benzotriazole (BTA), 5-methyl-1H-benzotriazole (5-MBTA), 3-amino-1,2,4-triazole, 5-phenyl-1H-tetrazole, 3-amino-5-methyl-4H-1,2,4-triazole, 5-aminotetrazole (ATZ), 1,2,4-triazole, tolitriazole, and a combination thereof.

In one embodiment, based on 100 parts by weight of the abrasive grains, the polishing composition for semiconductor processing may include the azole-based compound in an amount for example ranging from approximately 0.01 parts by weight to approximately 5.00 parts by weight, for example, ranging from approximately 0.01 parts by weight to approximately 4.50 parts by weight, for example, ranging from approximately 0.01 parts by weight to approximately 4.00 parts by weight, for example, ranging from approximately 0.01 parts by weight to approximately 3.50 parts by weight, for example, ranging from approximately 0.01 parts by weight to approximately 3.00 parts by weight, for example, ranging from approximately 0.01 parts by weight to approximately 2.50 parts by weight, for example, ranging from approximately 0.01 parts by weight to approximately 2.00 parts by weight, for example, ranging from approximately 0.01 parts by weight to approximately 1.50 parts by weight, for example, ranging from approximately 0.05 parts by weight to approximately 5.00 parts by weight, for example, ranging from approximately 0.10 parts by weight to approximately 5.00 parts by weight, for example, ranging from approximately 0.20 parts by weight to approximately 5.00 parts by weight, for example, ranging from approximately 0.10 parts by weight to approximately 4.00 parts by weight, for example, ranging from approximately 0.20 parts by weight to approximately 3.00 parts by weight, for example, ranging from approximately 0.20 parts by weight to approximately 2.50 parts by weight, for example, ranging from approximately 0.20 parts by weight to approximately 2.00 parts by weight, for example, ranging from approximately 0.20 parts by weight to approximately 1.50 parts by weight, for example, ranging from greater than approximately 0.20 parts by weight to approximately 1.50 parts by weight or less.

The additive may include an organic acid salt. The organic acid salt may mainly play a role in controlling the surface properties of the copper film. For example, the organic acid salt may include one or more selected from the group consisting of salicylate, benzoic acid salt, phthalate, and a combination thereof. In one embodiment, the organic acid salt may include salicylate, more specifically, betaine salicylate.

In one embodiment, based on 100 parts by weight of the abrasive grains, the polishing composition for semiconductor processing may include the organic acid salt in an amount for example ranging from approximately 0.01 parts by weight to approximately 5.00 parts by weight, for example, ranging from approximately 0.01 parts by weight to approximately 4.50 parts by weight, for example, ranging from approximately 0.01 parts by weight to approximately 4.00 parts by weight, for example, ranging from approximately 0.01 parts by weight to approximately 3.50 parts by weight, for example, ranging from approximately 0.01 parts by weight to approximately 3.00 parts by weight, for example, ranging from approximately 0.01 parts by weight to approximately 2.50 parts by weight, for example, ranging from approximately 0.01 parts by weight to approximately 2.00 parts by weight, for example, ranging from approximately 0.01 parts by weight to approximately 1.50 parts by weight, for example, ranging from approximately 0.05 parts by weight to approximately 5.00 parts by weight, for example, ranging from approximately 0.10 parts by weight to approximately 5.00 parts by weight, for example, ranging from approximately 0.50 parts by weight to approximately 5.00 parts by weight, for example, ranging from approximately 0.10 parts by weight to approximately 4.00 parts by weight, for example, ranging from approximately 0.50 parts by weight to approximately 3.00 parts by weight, for example, ranging from approximately 0.50 parts by weight to approximately 2.50 parts by weight, for example, ranging from approximately 0.50 parts by weight to approximately 2.00 parts by weight, for example, approximately 0.50 parts by weight to approximately 1.50 parts by weight, for example, ranging from greater than approximately 0.50 parts by weight to approximately 1.50 parts by weight or less.

In one embodiment, the polishing composition for semiconductor processing may include the azole-based compound and the organic acid salt, and the weight ratio of the azole-based compound to the organic acid salt may be greater than approximately 1:1, less than or equal to approximately 1:3, for example, ranging from approximately 1:1.2 to approximately 1:3.0, for example, ranging from approximately 1:1.5 to approximately 1:2.5, for example, ranging from approximately 1:1.8 to approximately 1:2.2. By using the azole-based compound and the organic acid salt in the weight ratio, polishing characteristics for the copper film may be properly adjusted.

The additive may include a phosphoric acid-based compound. The phosphoric acid-based compound may play a role in regulating the polishing characteristics of the silicon nitride film. For example, the phosphoric acid-based compound may include one or more selected from the group consisting of tetrapotassium pyrophosphate, phosphomolybdic acid, nitrilotris(methylenephosphonic acid), phosphorus trichloride, and a combination thereof.

In one embodiment, based on 100 parts by weight of the abrasive grains, the polishing composition for semiconductor processing may include the phosphoric acid-based compound in an amount for example ranging from approximately 0.10 parts by weight to approximately 2.00 parts by weight, for example, ranging from approximately 0.10 parts by weight to approximately 1.80 parts by weight, for example, ranging from approximately 0.10 parts by weight to approximately 1.60 parts by weight, for example, ranging from approximately 0.10 parts by weight to approximately 1.40 parts by weight, for example, ranging from approximately 0.10 parts by weight to approximately 1.20 parts by weight, for example, ranging from approximately 0.20 parts by weight to approximately 2.00 parts by weight, for example, ranging from approximately 0.40 parts by weight to approximately 2.00 parts by weight, for example, ranging from approximately 0.50 parts by weight to approximately 2.00 parts by weight, for example, ranging from approximately 0.60 parts by weight to approximately 2.00 parts by weight, for example, approximately 0.40 parts by weight to approximately 1.80 parts by weight, for example, ranging from approximately 0.40 parts by weight to approximately 1.60 parts by weight, for example, ranging from approximately 0.50 parts by weight to approximately 1.50 parts by weight, for example, ranging from approximately 0.50 parts by weight to approximately 1.40 parts by weight, for example, ranging from approximately 0.50 parts by weight to approximately 1.20 parts by weight, for example, ranging from approximately 0.60 parts by weight to approximately 1.40 parts by weight, for example, ranging from approximately 0.60 parts by weight to approximately 1.20 parts by weight.

The additive may include a fluorine-based compound. The fluorine-based compound may act as a surfactant that provides appropriate fluidity to the abrasive grains.

In the aqueous liquid state of 0.001% by weight, the fluorine-based compound may have a static surface tension of approximately 50 dynes/cm or less, for example, approximately 45 dynes/cm or less, for example, ranging from approximately 10 dynes/cm to approximately 50 dynes/cm, for example, ranging from approximately 10 dynes/cm to approximately 45 dynes/cm. In the aqueous liquid state of 0.01% by weight, the fluorine-based compound may have a static surface tension of approximately 30 dynes/cm or less, for example, approximately 25 dynes/cm or less, for example, ranging from approximately 5 dynes/cm to approximately 30 dynes/cm, for example, ranging from approximately 5 dynes/cm to approximately 25 dynes/cm. By applying the fluorine-based compound exhibiting such surface tension, the fluidity of the polishing composition for semiconductor processing may be properly secured, defects such as scratches may be prevented from occurring on the surface to be polished, and a polishing rate for each film may be implemented so that values of Equation 1, Equation 2, Equation 3, and/or Equation 4 satisfy the disclosed ranges. In addition, the surface of the silicon oxide film may be maintained in a state suitable for polishing by the fluorine-based compound, and a fluorine component may prevent growth of bacteria and fungi in the polishing composition for semiconductor processing, so the polishing composition may be stored for a long period of time.

In one embodiment, based on 100 parts by weight of the abrasive grains, the polishing composition for semiconductor processing may include the fluorine-based compound in an amount of, for example, ranging from approximately 0.01 to approximately 1.00 part by weight, for example, ranging from approximately 0.01 to approximately 0.80 parts by weight, for example, ranging from approximately 0.01 to approximately 0.70 parts by weight, for example, ranging from approximately 0.01 to approximately 0.60 parts by weight, for example, ranging from approximately 0.01 to approximately 0.50 parts by weight, for example, ranging from approximately 0.01 to approximately 0.40 parts by weight, for example, ranging from approximately 0.01 to approximately 0.30 parts by weight, for example, ranging from approximately 0.01 to approximately 0.20 parts by weight, for example, ranging from approximately 0.02 to approximately 1.00 part by weight, for example, ranging from approximately 0.03 to approximately 1.00 part by weight, for example, ranging from approximately 0.04 to approximately 1.00 part by weight, for example, ranging from approximately 0.05 to approximately 1.00 part by weight, for example, ranging from approximately 0.02 to approximately 0.50 parts by weight, for example, ranging from approximately 0.03 to approximately 0.40 parts by weight, for example, ranging from approximately 0.04 to approximately 0.30 parts by weight, for example, ranging from approximately 0.05 to approximately 0.30 parts by weight, for example, ranging from approximately 0.05 to approximately 0.20 parts by weight.

In addition to the abrasive grains and the additive, the polishing composition for semiconductor processing may include a residual amount of a solvent. For example, the solvent may be water ($H_2O$), specifically ultra-pure water.

The polishing composition for semiconductor processing may have a solids content for example ranging from approximately 3.5% by weight to approximately 20% by weight, for example, ranging from approximately 3.5% by weight to approximately 15% by weight, for example, ranging from approximately 3.5% by weight to approximately 10% by weight. When the solids content is too low, the polishing rate for each film of the polishing target may not be sufficiently secured. When the solids content is too high, defects such as scratches may occur during the polishing process due to unnecessary agglomeration. By including solids within the above range(s), while the polishing composition for semiconductor processing includes the abrasive grains, the additive, and the solvent, the flow rate may be constant in the polishing process, and uniform dispersibility and storage stability may be secured during the distribution and storage process of the polishing composition for semiconductor processing.

As described above, in the polishing composition for semiconductor processing, values of Equation 1, Equation 2, Equation 3, and/or Equation 4, each of which is based on a polishing rate for each of the silicon oxide film, the silicon nitride film, and the copper film, may satisfy the disclosed respective ranges. Accordingly, flatness may be realized without defects such as dishing, protrusion, erosion, and/or peaking for the surface to be polished including different films at the same time. More specifically, a technical advantage of maximizing this effect may be implemented for a semiconductor wafer containing a through-silicon via (TSV) with a specific structure and pattern.

In another embodiment, the present disclosure provides a method of fabricating a semiconductor device including an operation of preparing a surface plate on which a polishing pad having a polishing surface is mounted; an operation of preparing a carrier for accommodating a polishing target; an operation of rotating the surface plate and the carrier while placing the polishing surface of the polishing pad and a surface to be polished of the polishing target in contact with each other; and an operation of applying a polishing the polishing composition for semiconductor processing onto the polishing surface, wherein the polishing composition for semiconductor processing includes abrasive grains and at least one additive and has an etching ratio correlation value of Equation 1 below ranging from approximately 1.45 to approximately 1.90:

$$\frac{R_O^2}{(R_{Cu} \times R_N)}. \qquad \text{[Equation 1]}$$

In Equation 1, $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film.

At this time, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

In the method of fabricating a semiconductor device, by applying the polishing composition for semiconductor processing in which the correlation value of Equation 1 satisfies the predetermined range, when a semiconductor wafer having a structure that requires simultaneous polishing of different layers, such as a through-silicon via (TSV), is used as a polishing target, different layers may be polished to have substantially the same flatness. As a result, a semiconductor device having improved quality may be fabricated.

Matters related to the polishing composition for semiconductor processing applied to the method of fabricating a semiconductor device may be integrally applied to both a case in which the above-mentioned matters regarding the polishing composition for semiconductor processing (according to one embodiment) are repeatedly used and a case (according to another embodiment) in which the above-mentioned matters are not repeatedly used.

In the polishing composition for semiconductor processing applied to the method of fabricating a semiconductor device, the values of Equation 2, Equation 3, and/or Equation 4 may satisfy the above-described ranges, respectively.

Figure 4:
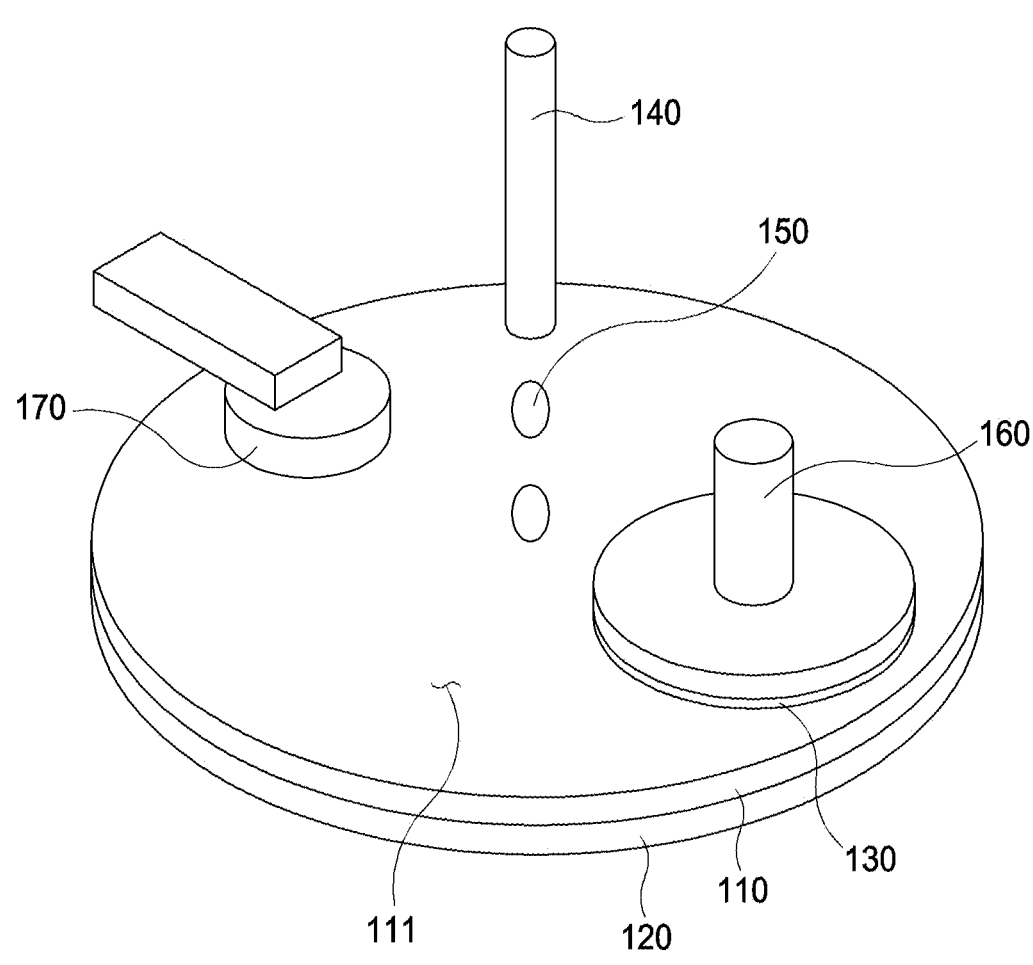
FIG. 4 schematically illustrates a device configuration related to a method of fabricating the semiconductor device according to one embodiment.

FIG. 4 schematically illustrates a device configuration related to the method of fabricating a semiconductor device according to one embodiment. Referring to FIG. 4, the method of fabricating a semiconductor device may include an operation of preparing a surface plate 120 on which a polishing pad 110 having a polishing surface is mounted; and an operation of preparing a carrier 160 for accommodating a polishing target 130.

In the method of fabricating a semiconductor device, the polishing target 130 may include a semiconductor wafer having a through-silicon via (TSV). Referring to FIGS. 1 to 3, the semiconductor wafer 100 having the TSV as the polishing target 130 may include the substrate 50 and the silicon nitride film 20 and the silicon oxide film 40 disposed on the substrate 50. In addition, the semiconductor wafer 100 may include the through-silicon via 10, and the through-silicon via 10 may include a via 11 penetrating both the substrate 50 and the copper electrode 30 charged therein.

Referring to FIGS. 2 and 3, in one embodiment, the silicon nitride film 20 has a structure in which part or all thereof surrounds the periphery of the copper electrode 30. Accordingly, the silicon nitride film 20 having such a structure may function as a barrier film that prevents diffusion of copper atoms from the copper electrode to the substrate 50. The ratio (D2/D1) of the diameter (D2) of the copper electrode 30 to the total diameter (D1) of the copper electrode 30 and the silicon nitride film 20 surrounding the copper electrode 30 may, for example, range from approximately 0.5 to approximately 1.0, for example, range from approximately 0.7 to approximately 1.0, for example, range from approximately 0.5 or more to less than approximately 1.0, for example, range from approximately 0.7 or more to less than approximately 1.0. By using a semiconductor wafer having the pattern structure described above as a polishing target, the feature that the numerical ranges of Equation 1, Equation 2, Equation 3, and/or Equation 4 of the polishing composition for semiconductor processing satisfy the above-described ranges may have a correlation indicative of the polishing result with the effect of preventing excessive dishing or protrusion of the copper electrode 30.

In one embodiment, the ratio (2T1/D1) of the thickness (T1) of the silicon nitride film 20 to the total diameter (D1) of the copper electrode 30 and the silicon nitride film 20 surrounding the copper electrode 30 may for example range from approximately 0.1 to approximately 0.5, for example, range from approximately 0.1 to approximately 0.3. By using a semiconductor wafer having the pattern structure described above as a polishing target, the feature that the numerical ranges of Equation 1, Equation 2, Equation 3, and/or Equation 4 of the polishing composition for semiconductor processing satisfy the above-described ranges may have a correlation with the effect of preventing peaking of the silicon nitride film 20.

Referring back to FIG. 4, the method of fabricating a semiconductor device in one embodiment may include an operation of preparing the surface plate 120 on which the polishing pad 110 having the polishing surface 111 is mounted. In one embodiment, the polishing pad 110 may include a polishing layer, and the polishing layer may include the polishing surface 111. For example, the polishing layer 110 may include a cured product of a polishing composition including a urethane-based prepolymer, but the present disclosure is not particularly limited thereto. For example, the urethane-based prepolymer may include a reaction product of an isocyanate compound and a polyol compound.

In one embodiment, the polishing surface 111 may have a Shore D surface hardness for example ranging from approximately 45 to approximately 70, for example, ranging from approximately 50 to approximately 70, for example, ranging from approximately 55 to approximately 70, for example, ranging from approximately 45 to approximately 65, for example, ranging from approximately 45 to approximately 60, for example, approximately 50 to approximately 65, for example, ranging from approximately 55 to approximately 60 at 25° C. Methods of measuring Shore D surface hardness commonly used in the art may be used in the present disclosure. For example, after preparing a specimen by cutting the polishing pad into a size of 2 cm×2 cm (thickness: 2 mm), the specimen is allowed to stand under the conditions of a temperature of 25° C. and a relative humidity of 50±5% for 16 hours, and then the surface hardness thereof is measured using a D-type hardness tester. By applying the polishing pad having the polishing surface having such a surface hardness to the method of fabricating a semiconductor device, the technical advantage of the polishing composition for semiconductor processing supplied onto the polishing surface may be further maximized. Specifically, after the polishing composition for semiconductor processing is supplied onto the polishing surface, the polishing composition polishes the surface to be polished while flowing at the interface between the polishing surface and the surface to be polished of the polishing target. As the polishing surface exhibits such surface hardness, the contact interface with the surface to be polished through the polishing composition for semiconductor processing may exhibit an appropriate elasticity, and occurrence of defects on the surface to be polished may be prevented.

The method of fabricating a semiconductor device may include an operation of rotating the surface plate 120 and the carrier 160 while placing the polishing surface 111 of the polishing pad 110 and a surface to be polished of the polishing target 130 in contact with each other. The polishing pad 110 is mounted on the surface plate 120 so that the polishing surface 111 thereof is the uppermost surface, and the polishing target 130 is accommodated in the carrier 160 so that the surface to be polished thereof is the lowermost surface. As a result, the polishing surface 111 and the surface to be polished may be arranged to contact each other. Contact between the polishing surface 111 and the surface to be polished may be interpreted to include direct physical contact and indirect contact through the abrasive grains in the polishing composition for semiconductor processing.

As the surface plate 120 rotates, in one embodiment, the polishing pad 110 also rotates at the same trajectory and speed. In addition, as the carrier 160 rotates, in one embodiment, the polishing target 130 also rotates at the same trajectory and speed. The surface plate 120 and the carrier 160 may rotate in the same direction or in different directions.

In one embodiment, the surface plate 120 and the carrier 160 may rotate at a rotation speed for example ranging from approximately 10 rpm to approximately 500 rpm, for example, ranging from approximately 30 rpm to approximately 200 rpm. When the surface plate 120 and the carrier 160 rotate at the rotation speed within this range, the friction behavior of the polishing surface 111 and the surface to be polished by the generated centrifugal force is correlated with the polishing composition 150 for semiconductor processing supplied onto the polishing surface 111, so that polishing flatness for the surface to be polished may be secured and defects such as protrusion and dishing may be prevented. More specifically, due to the structure of the TSV, a polishing result for a surface to be polished simultaneously including the copper film, the silicon oxide film, and the silicon nitride film may be advantageously achieved.

In one embodiment, the rotation speed of the carrier 160 may be greater than the rotation speed of the surface plate 120. By rotating the carrier 160 at a higher speed than the surface plate 120, polishing stability may be secured, and the surface to be polished of the polishing target 130 may be polished without defects.

In one embodiment, in the method of fabricating a semiconductor device, the surface plate 120 and the carrier 160 may be rotated under the condition that the carrier 160 presses the polishing surface 111. By pressing the polishing surface 111 under a predetermined pressure condition by the carrier 160, when the surface to be polished of the polishing target 130 is polished in direct contact with the polishing surface 111 of the polishing pad 110, and when the surface to be polished is polished indirectly through the polishing composition 150 for semiconductor processing, a polishing performance not having the defects noted above may be implemented. For example, a load applied by the carrier 160 to the polishing surface 111 may be approximately 0.01 psi to approximately 20 psi, for example, approximately 0.1 psi to approximately 15 psi.

The method of fabricating a semiconductor device includes an operation of applying the polishing composition 150 for semiconductor processing onto the polishing surface 111. Specifically, the polishing composition 150 for semiconductor processing may be applied onto the polishing surface 111 through a supply nozzle 140.

In one embodiment, the flow rate of the polishing composition 150 for semiconductor processing supplied through the supply nozzle 140 may for example range from approximately 10 mL/min to approximately 1,000 mL/min, for example, range from approximately 10 mL/min to approximately 800 mL/min, for example, range from approximately 50 mL/min to approximately 500 mL/min. When the polishing composition 150 for semiconductor processing that satisfies Equation 1, Equation 2, Equation 3, and/or Equation 4 in the respective predetermined ranges is applied onto the polishing surface at a flow rate within these ranges, a friction behavior between the polishing surface 111 and the surface to be polished of the polishing target 130 using the polishing composition as a medium may improve the polishing performance of the surface to be polished. More specifically, due to the structure of the TSV, polishing flatness may be secured and defects such as protrusion and dishing may be prevented in the polishing results for the surface to be polished that includes the copper film, the silicon oxide film, and the silicon nitride film at the same time.

The polishing composition 150 for semiconductor processing may include abrasive grains; and at least one additive, and properties if the abrasive grains and the additive are the same as those described for the polishing composition(s) for semiconductor processing. That is, all specific examples of the abrasive grains and the additive(s) described above for the polishing composition for semiconductor processing and the technical advantages thereof may be applied to the polishing composition for semiconductor processing applied to the method of fabricating a semiconductor. In relation to other configurations of the method of fabricating a semiconductor, for example, the structure and operation of the surface plate and the carrier, advantageous interactions may be achieved in terms of achieving the technical goals.

Referring to FIG. 4, the method of fabricating a semiconductor device may further include an operation of processing the polishing surface 111 of the polishing pad 110 through a conditioner 170. The polishing surface 111 of the polishing pad 110 is chemically affected as the polishing composition 150 for semiconductor processing is continuously supplied, and at the same time, is physically affected due to physical contact with the surface of the polishing target 130 to be polished. When the polishing surface 111 is deformed due to these chemical/physical effects, it may be difficult to maintain uniform polishing performance for the surface to be polished. The conditioner 170 provides a way to process polishing surface 111 during the polishing process, and may contribute to maintaining the polishing surface 111 in a state suitable for polishing throughout the polishing process.

For example, the conditioner 170 may serve to roughen the polishing surface 111 while rotating at a predetermined speed. The rotation speed of the conditioner 170 may be, for example, ranging from approximately 10 rpm to approximately 500 rpm, for example, ranging from approximately 50 rpm to approximately 500 rpm, for example, ranging from approximately 100 rpm to approximately 500 rpm, for example, ranging from approximately 200 rpm to approximately 500 rpm, for example, ranging from greater than approximately 200 rpm, less than approximately 400 rpm.

The conditioner 170 may rotate while pressurizing the polishing surface 111 of the polishing pad 110 with a predetermined pressure. For example, a pressure applied to the polishing surface 111 by the conditioner 170 may for example range from approximately 1 psi to approximately 20 psi, for example, range from approximately 1 psi to approximately 15 psi, for example, range from approximately 5 psi to approximately 15 psi, for example, range from approximately 5 psi to approximately 10 psi.

By performing surface treatment under the above process conditions through the conditioner 170, the polishing surface 111 may be maintained in an acceptable state throughout the polishing process, and the polishing lifespan may be extended under the application condition of the polishing composition 150 for semiconductor processing.

According to the method of fabricating a semiconductor device, in polishing the polishing target, specifically, a semiconductor wafer having a through-silicon via (TSV), through the above-described characteristics, different types of films may be simultaneously polished to be flat. In particular, by applying the polishing composition for semiconductor processing that satisfies Equation 1, Equation 2, Equation 3, and/or Equation 4 within the respective predetermined ranges, these technical advantages may be achieved, and as a result, a semiconductor device having improved quality may be provided.

Referring to FIGS. 1 and 2, the method of fabricating a semiconductor device according to one embodiment may include an operation of forming the substrate 50 including the via 11; an operation of forming the copper electrode 30 disposed in the via 11; an operation of forming the silicon nitride film 20 on the substrate 50 and the copper electrode 30; an operation of forming the silicon oxide film 40 on the silicon nitride film 20; and an operation of polishing the copper electrode 30, the silicon nitride film 20, and the silicon oxide film 40 using the polishing composition for semiconductor processing.

The substrate 50 in one embodiment is a semiconductor substrate. The substrate 50 may be a silicon wafer.

The via 11 penetrates at least a portion of the substrate 50. The via 11 may be a groove formed by a selective etching process of the substrate 50.

The copper electrode 30 is placed in the via 11. The copper electrode 30 may be formed by a vacuum deposition process such as a sputtering process. A barrier layer including tantalum oxide or the like may be formed between the copper electrode 30 and the via 11.

The silicon nitride film 20 may be formed by a chemical vapor deposition process or the like. The silicon nitride film 20 may cover the substrate 50 and the copper electrode 30.

The silicon oxide film 40 may be formed by a chemical vapor deposition process or the like. The silicon oxide film 40 may cover the silicon nitride film 20.

The polishing step may proceed as described above.

In addition, the polishing composition for semiconductor processing may include abrasive grains and at least one additive. The polishing composition for semiconductor processing may have the above-described characteristics.

In addition, in the method of fabricating a semiconductor device according to one embodiment, the value of Equation 1 may have the above characteristics.

In addition, in the method of fabricating a semiconductor device according to one embodiment, the value of Equation 2 may have the above characteristics.

In addition, in the method of fabricating a semiconductor device according to one embodiment, the value of Equation 3 may have the above characteristics.

In addition, in the method of fabricating a semiconductor device according to one embodiment, the value of Equation 4 may have the above characteristics.

Here, in Equations 1, 2, 3, and 4, $R_O$ represents the polishing rate (Å/min) of the polishing composition for semiconductor processing for the silicon oxide film 40, $R_N$ represents the polishing rate (Å/min) of the polishing composition for semiconductor processing for the silicon nitride film 20, and $R_{Cu}$ represents the polishing rate (Å/min) of the polishing composition for semiconductor processing for the copper electrode 30.

In the method of fabricating a semiconductor device according to one embodiment, after the operation of polishing the copper electrode 30, the silicon nitride film 20, and the silicon oxide film 40, a height difference between the polishing surface of the copper electrode 30 and the polishing surface of the silicon nitride film 20 may be less than approximately 5 nm. That is, after the polishing, a height difference between a protruding portion of the silicon nitride film 20 and the copper electrode 30 may be less than approximately 5 nm.

In the method of fabricating a semiconductor device according to one embodiment, after the operation of polishing the copper electrode 30, the silicon nitride film 20, and the silicon oxide film 40, a height difference between the polishing surface of the copper electrode 30 and the polishing surface of the silicon oxide film 40 may be less than approximately 20 nm. That is, a height difference between the upper portion of the copper electrode 30 and the upper portion of the silicon oxide film 40 may be less than approximately 20 nm.

In the method of fabricating a semiconductor device according to another embodiment, since the polishing composition for semiconductor processing and the polishing process are used, the semiconductor wafer 100 having improved flatness may be obtained.

A polishing composition for semiconductor processing according to one embodiment can be applied in a semiconductor process including a process of polishing a semiconductor wafer, more specifically, a process of polishing a semiconductor wafer including a through-silicon via (TSV), can improve polishing performance, can minimize defects such as dishing, erosion, and protrusion, and can realize an evenly polished surface without deviation between films when polishing a surface where a plurality of different films is exposed to the outside.

In addition, when using a method of fabricating a semiconductor device using the polishing composition of the present disclosure for semiconductor processing, defect rate can be minimized so that memory chip functions are implemented without errors or defects in a plurality of laminated chips connected by a TSV.

Hereinafter, specific embodiments of the present disclosure are presented. However, the embodiments described below are provided to specifically illustrate or explain the present disclosure, and the scope of the present disclosure is not limited by these embodiments.

Examples and Comparative Examples

Colloidal silica (Nouryon, EXSKC-01) was used as the abrasive grains. The surface of the silica particles was modified with a silane composition having a weight ratio of amino silane to epoxy silane of 9:1. At this time, the case of using the silane composition in an amount of 0.01 parts by weight based on 100 parts by weight of the abrasive grains was set as 100% surface modification rate, the surface modification rates of Examples and Comparative Examples for the abrasive grains were modified as shown in Tables 1 to 3 below. 5-aminotetrazole (Merck Korea, EL grade), betaine salicylate (BNOCHEM), tetrapotassium pyrophosphate (Seoul IC, SIC-801), acetic acid, and a fluorine-based compound (Dupont, Capstone FS-3100) were added to the abrasive grains, and these components were mixed. At this time, based on 100 parts by weight of the silica particles, the components were added in the contents shown in Tables 1 to 3 below. A polishing composition for semiconductor processing was prepared by mixing an ultrapure solvent so that the solids content was 15% by weight.

Evaluation

Experimental Example 1: Hydrogen Ion Concentration (pH) Measurement

The pH of each of the polishing compositions for semiconductor processing of Examples and Comparative Examples was measured using a hydrogen ion concentration (pH) measurement device (Horiba CO., Laqua) while stirring the polishing compositions at 200 rpm at a room temperature of 20° C. to 25° C. The results are shown in Tables 1 to 3 below.

Experimental Example 2: Polishing Rate Measurement and Derivation of Values of Equations 1 to 4

A copper film wafer having a thickness of approximately 20,000 Å, a silicon nitride film wafer having a thickness of approximately 12,000 Å, and a silicon oxide film wafer having a thickness of approximately 20,000 Å were prepared. As shown in FIG. 4, as the polishing target 130, each wafer was accommodated in the carrier 160 with the surface to be polished facing downward. The carrier 160 and the surface plate 120 on which the polishing pad 110 (SKC Co., HD-319B) having the upward facing polishing surface 111 was mounted were disposed so that the surface to be polished and the polishing surface 111 were in contact with each other. Then, each configuration was operated for 60 seconds under the condition that pressure applied to the polishing surface by the carrier 160 was 3.0 psi, the rotation speed of the carrier 160 was 120 rpm, and the rotation speed of the surface plate 120 was 117 rpm. 100 parts by weight of each of the polishing compositions for semiconductor processing of Examples and Comparative Examples, and 0.25 parts by weight of hydrogen peroxide were mixed, and then polishing was performed while applying the mixture at a flow rate of 300 ml/min onto the polishing surface. At the same time, the conditioner 170 (Saesol Diamond Co., SKC-C145) was operated at a rotation speed of 250 rpm under a pressure of 8 psi to process the polishing surface. After polishing, the thickness of each wafer was measured, and polishing rate (Å/min) was calculated. Using the measured polishing rate values for each film, the values of Equations 1 to 4 were calculated, and the results are shown in Tables 1 to 3.

Experimental Example 3: Evaluation of Polishing Performance

Referring to FIG. 3, a wafer having a total diameter of 300 mm and having a pattern including a through-silicon via (TSV) having the copper electrode 30 having a diameter (D2) of 5 μm and a second silicon nitride film 22 having a thickness (T1) of 0.5 μm and located on the outside of the copper electrode 30 to surround the copper electrode 30 was prepared. As shown in FIG. 4, as the polishing target 130, each wafer was accommodated in the carrier 160 with the surface to be polished facing downward. The carrier 160 and the surface plate 120 on which the polishing pad 110 (SKC Co., HD-319B) having the upward facing polishing surface 111 was mounted were disposed so that the surface to be polished and the polishing surface 111 were in contact with each other. Then, each configuration was operated for 60 seconds under the condition that pressure applied to the polishing surface by the carrier 160 was 3.0 psi, the rotation speed of the carrier 160 was 120 rpm, and the rotation speed of the surface plate 120 was 117 rpm. 100 parts by weight of each of the polishing compositions for semiconductor processing of Examples and Comparative Examples, and 0.25 parts by weight of hydrogen peroxide were mixed, and then polishing was performed while applying the mixture at a flow rate of 300 ml/min onto the polishing surface. After polishing, a cleaning process was performed while spraying a cleaning solution at a brush rotation speed of 500 rpm for 60 seconds under spray conditions of 2,000 cc/min. Then, with respect to the surface to be polished of the pattern wafer, the diameter from the center to the end was divided into 3 parts, and sampling was performed with a size of 1 cm×1 cm (width×height) in each area. Then, for each, non-contact atomic force microscopy (AFM) analysis was performed using AFM analysis equipment (Park system Co., NX-20). Specifically, the analysis area was 80 μm×80 μm (horizontal×vertical), and the tip profiling scan speed was 8 μm/s.

For the case of applying each of the polishing compositions for semiconductor processing of Examples and Comparative Examples, as shown in FIG. 5A, the degree of dishing of the copper electrode 30 was measured, and the measurement results are shown in Tables 1 to 3 below, with the direction in which dishing proceeded relative to the plane as a (+) value. That is, the value of (−) in Tables 1 to 3 below indicates the degree of protrusion of the copper electrode 30 as shown in FIG. 5B.

In addition, for the case of applying each of the polishing compositions for semiconductor processing of Examples and Comparative Examples, based on the criterion for evaluating that SiN peaking occurred when the height of the second silicon nitride film 22 exceeded 5 nm with the uppermost surface of the silicon oxide film 40 as the reference plane, occurrence (O) or non-occurrence (X) of SiN peaking was evaluated, and the results are shown in Tables 1 to 3 below. In addition, for the case of applying each of the polishing compositions for semiconductor processing of Examples and Comparative Examples, based on the criterion for evaluating that erosion occurred when the depth exceeded 10 nm when the through-silicon via (TSV) and the copper film, the silicon nitride film, and the silicon nitride film constituting the periphery thereof were over-polished compared to the surrounding silicon oxide film constituting most of the area of the semiconductor wafer, as shown in FIG. 5D, with the uppermost surface of the silicon oxide film 40 as the reference plane, occurrence (O) or non-occurrence (X) of erosion was evaluated, and the results are shown in Tables 1 to 3 below.

TABLE 1

|  | Classification | Units | Example 1 | Example 2 | Example 3 | Example 4 |
|---|---|---|---|---|---|---|
| Abrasive grains Composition | Type | — | SiO$_2$ | SiO$_2$ | SiO$_2$ | SiO$_2$ |
|  | Surface modification rate | % | 100 | 150 | 150 | 100 |
|  | Abrasive grains | parts by weight | 100 | 100 | 100 | 100 |
|  | 5-aminotetrazole | parts by weight | 0.067 | 0.067 | 0.067 | 0.067 |
|  | Betaine salicylate | parts by weight | 0.133 | 0.133 | 0.133 | 0.133 |
|  | Potassium pyrophosphate | parts by weight | 0.02 | 0.02 | 0.03 | 0.03 |
|  | Fluorine-based compound | parts by weight | 0.002 | 0.002 | 0.002 | 0.005 |
|  | Acetic acid | parts by weight | 0.075 | 0.075 | 0.05 | 0.075 |
| polishing rate | Copper film | Å/min | 4324 | 4227 | 4489 | 4317 |
|  | Silicon nitride film | Å/min | 2524 | 2321 | 2724 | 2497 |
|  | Silicon oxide film | Å/min | 4189 | 4025 | 4332 | 4221 |
| Parameters | Equation 1 | — | 1.61 | 1.65 | 1.53 | 1.65 |
|  | Equation 2 | — | 122.94 | 133.50 | 117.64 | 126.17 |
|  | Equation 3 | — | 0.97 | 0.95 | 0.97 | 0.98 |
|  | Equation 4 | — | 1.71 | 1.82 | 1.65 | 1.73 |
| Polishing performance | SiN peaking | — | X | X | X | X |
|  | Erosion | — | X | X | X | X |
|  | Cu dishing | nm | 3 | 7 | 12 | 4 |

TABLE 2

|  | Classification | Units | Comparative Example 1 | Comparative Example 2 | Comparative Example 3 | Comparative Example 4 |
|---|---|---|---|---|---|---|
| Abrasive grains Composition | Type | — | SiO$_2$ | SiO$_2$ | SiO$_2$ | SiO$_2$ |
|  | Surface modification rate | % | 200 | 300 | 100 | 100 |
|  | Abrasive grains | parts by weight | 100 | 100 | 100 | 100 |
|  | 5-aminotetrazole | parts by weight | 0.067 | 0.067 | 0.133 | 0.033 |
|  | Betaine salicylate | parts by weight | 0.133 | 0.133 | 0.133 | 0.133 |
|  | Potassium pyrophosphate | parts by weight | 0.02 | 0.02 | 0.02 | 0.02 |
|  | Fluorine-based compound | parts by weight | 0.002 | 0.002 | 0.002 | 0.002 |
|  | Acetic acid | parts by weight | 0.075 | 0.075 | 0.075 | 0.075 |
| Polishing rate | Copper film | Å/min | 4423 | 4534 | 3824 | 4823 |
|  | Silicon nitride film | Å/min | 1824 | 1542 | 2476 | 2489 |
|  | Silicon oxide film | Å/min | 4023 | 3824 | 4203 | 4160 |
| Parameters | Equation 1 | — | 2.01 | 2.09 | 1.87 | 1.44 |
|  | Equation 2 | — | 236.56 | 330.61 | 100.25 | 156.20 |
|  | Equation 3 | — | 0.91 | 0.84 | 1.10 | 0.86 |
|  | Equation 4 | — | 2.42 | 2.94 | 1.54 | 1.94 |
| Polishing performance | SiN peaking | — | O | O | X | O |
|  | Erosion | — | X | X | X | X |
|  | Cu dishing | nm | 9 | 17 | −24 | 38 |

TABLE 3

| Classification | | Units | Comparative Example 5 | Comparative Example 6 | Comparative Example 7 |
|---|---|---|---|---|---|
| Abrasive grains | Type | — | SiO$_2$ | SiO$_2$ | SiO$_2$ |
| | Surface modification rate | % | 100 | 100 | 100 |
| Composition | Abrasive grains | parts by weight | 100 | 100 | 100 |
| | 5-aminotetrazole | parts by weight | 0.067 | 0.067 | 0.067 |
| | Betaine salicylate | parts by weight | 0.133 | 0.133 | 0.133 |
| | Potassium pyrophosphate | parts by weight | 0.01 | 0.04 | 0.06 |
| | Fluorine-based compound | parts by weight | 0.002 | 0.002 | 0.002 |
| | Acetic acid | parts by weight | 0.075 | 0.075 | 0.075 |
| Polishing rate | Copper film | Å/min | 4129 | 4278 | 4135 |
| | Silicon nitride film | Å/min | 1623 | 2821 | 2912 |
| | Silicon oxide film | Å/min | 4181 | 4038 | 4115 |
| Parameters | Equation 1 | — | 2.61 | 1.35 | 1.41 |
| | Equation 2 | — | 270.60 | 92.86 | 82.97 |
| | Equation 3 | — | 1.01 | 0.94 | 1.00 |
| | Equation 4 | — | 2.54 | 1.52 | 1.42 |
| Polishing performance | SiN peaking | — | X | X | X |
| | Erosion | — | X | X | X |
| | Cu dishing | nm | 3 | 7 | 12 |

As shown in Tables 1 to 3, in the case of the polishing compositions for semiconductor processing of Examples 1 to 4, when the values of Equation 1 are within a range of approximately 1.45 to 5 approximately 1.90, for example, approximately 1.50 to approximately 1.70, no defects such as peaking and erosion occurred. In addition, the degree of copper film dishing is less than 15 nm. These results demonstrate an optimized polishing performance is implemented in polishing a semiconductor wafer including a through-silicon via (TSV). In contrast, in the case of the polishing compositions for semiconductor processing of Comparative Examples 1 to 7, the values of Equation 1 are less than approximately 1.45 or greater than approximately 1.90. The polishing compositions for semiconductor processing of Examples 1 to 4 effectively prevent defects such as peaking, erosion, and dishing at the same time. However, in the case of the polishing compositions for semiconductor processing of Comparative Examples 1 to 7, one of these defects occurs. Based on these results, it can be confirmed that Comparative Examples 1 to 7 do not achieve the technical goal of the present disclosure and demonstrate non-optimized polishing.

DESCRIPTION OF SYMBOLS

100: SEMICONDUCTOR WAFER
10: THROUGH-SILICON VIA
11: VIA
20: SILICON NITRIDE FILM
30: COPPER ELECTRODE
40: SILICON OXIDE FILM
50: SUBSTRATE
110: POLISHING PAD

111: POLISHING SURFACE
120: SURFACE PLATE
130: POLISHING TARGET
140: NOZZLE
150: COMPOSITION FOR SEMICONDUCTOR PROCESSING
160: CARRIER
170: CONDITIONER
D1: TOTAL DIAMETER OF COPPER ELECTRODE AND SILICON NITRIDE FILM
D2: DIAMETER OF COPPER ELECTRODE
T1: THICKNESS OF SILICON NITRIDE FILM

What is claimed is:

1. A polishing composition for semiconductor processing, comprising:
   abrasive grains; and
   at least one additive,
   wherein the polishing composition has an etch rate ratio correlation value ranging from 1.45 to 1.90 as calculated by Equation 1 below:

$$\frac{R_O^2}{(R_{Cu} \times R_N)},$$ [Equation 1]

wherein $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film, wherein, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

2. The polishing composition according to claim 1, having a value ranging from 110.0 to 230.0 as calculated by Equation 2 below:

$$\left(\frac{R_{Cu}}{R_N}\right)^2 \times \frac{R_O}{100},$$ [Equation 2]

wherein $R_O$, $R_N$, and $R_{Cu}$ are as defined in Equation 1.

3. The polishing composition according to claim 1, having a value ranging from 0.90 to 1.00 as calculated by Equation 3 below:

$$\frac{R_O}{R_{Cu}},$$ [Equation 3]

wherein $R_O$ and $R_{Cu}$ are as defined in Equation 1.

4. The polishing composition according to claim 1, having a value ranging from 1.55 to 2.40 as calculated by Equation 4 below:

$$\frac{R_{Cu}}{R_N}, \qquad \text{[Equation 4]}$$

wherein $R_N$ and $R_{Cu}$ are as defined in Equation 1.

5. The polishing composition according to claim 1, wherein the abrasive grains are selected from one or more of the group consisting of silica ($SiO_2$), ceria ($CeO_2$), alumina ($Al_2O_3$), zirconia ($ZrO_2$), and a combination thereof.

6. The polishing composition according to claim 1, wherein the abrasive grains have a positive (+) zeta potential value.

7. The polishing composition according to claim 1, wherein the additive comprises one or more selected from the group consisting of an azole-based compound, a phosphoric acid-based compound, a fluorine-based compound, an organic acid, and a combination thereof.

8. A method of fabricating a semiconductor device, comprising:

preparing a surface plate on which a polishing pad having a polishing surface is mounted;

preparing a carrier for accommodating a polishing target;

rotating the surface plate and the carrier while placing the polishing surface of the polishing pad and a surface to be polished of the polishing target in contact with each other; and applying a polishing composition for semiconductor processing onto the polishing surface, wherein the polishing composition for semiconductor processing comprises abrasive grains and at least one additive, and has an etch rate ratio correlation value ranging from 1.45 to 1.90 as calculated by Equation 1 below:

$$\frac{R_O^2}{(R_{Cu} \times R_N)}, \qquad \text{[Equation 1]}$$

wherein $R_O$ represents a polishing rate (Å/min) of the polishing composition for semiconductor processing for a silicon oxide film, $R_N$ represents a polishing rate (Å/min) of the polishing composition for semiconductor processing for a silicon nitride film, and $R_{Cu}$ represents a polishing rate (Å/min) of the polishing composition for semiconductor processing for a copper film, wherein, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while applying the mixture containing the polishing composition for semiconductor processing at a flow rate of 300 mL/min onto the polishing surface under conditions of a carrier pressurization of 3.0 psi, a carrier rotation speed of 120 rpm, and a surface plate rotation speed of 117 rpm, and then $R_O$, $R_N$, and $R_{Cu}$ are measured.

9. The method according to claim 8, wherein the polishing target comprises a semiconductor wafer having a through-silicon via.

10. The method according to claim 8, wherein the surface plate and the carrier rotate at a rotation speed of 10 rpm to 500 rpm.

11. The method according to claim 8, wherein the polishing composition for semiconductor processing is applied onto the polishing surface at a flow rate ranging from 10 mL/min to 1,000 mL/min.

12. A method of fabricating a semiconductor device, comprising:

forming a substrate comprising a via;

forming a copper electrode disposed on the via;

forming a silicon nitride film on the substrate and the copper electrode;

forming a silicon oxide film on the silicon nitride film; and polishing the copper electrode, the silicon nitride film, and the silicon oxide film using a polishing composition for semiconductor processing, wherein the polishing composition for semiconductor processing comprises abrasive grains and at least one additive, and has an etch rate ratio correlation value ranging from 1.45 to 1.90 as calculated by Equation 1 below:

$$\frac{R_O^2}{(R_{Cu} \times R_N)}, \qquad \text{[Equation 1]}$$

wherein $R_O$ represents a polishing rate (Å/min) of the polishing composition for semiconductor processing for the silicon oxide film, $R_N$ represents a polishing rate (Å/min) of the polishing composition for semiconductor processing for the silicon nitride film, and R Cu represents a polishing rate (Å/min) of the polishing composition for semiconductor processing for the copper electrode, and wherein, when $R_O$, $R_N$, and $R_{Cu}$ are measured, 100 parts by weight of the polishing composition for semiconductor processing and 0.25 parts by weight of hydrogen peroxide are mixed to obtain a mixture, polishing of a wafer having the silicon oxide film, a wafer having the silicon nitride film, and a wafer having the copper film is performed for 60 seconds while introducing the mixture containing the polishing composition for semiconductor processing at a flow rate of 300 mL/min under conditions of a carrier pressurization of 3.0 psi, a carrier rotation speed of 120 rpm, and a surface plate rotation speed of 117 rpm, and then $R_O$, $R_N$, and $R_{Cu}$ are measured.

13. The method according to claim 12, wherein the etch rate ratio correlation value calculated by Equation 1 ranges from 1.50 to 1.80.

14. The method according to claim 12, wherein a value calculated by Equation 2 below ranges from approximately 110 to approximately 230:

$$\left(\frac{R_{Cu}}{R_N}\right)^2 \times \frac{R_O}{100}. \qquad \text{[Equation 2]}$$

15. The method according to claim 14, wherein a value calculated by Equation 3 below ranges from 0.9 to 1:

$$\frac{R_O}{R_{Cu}}. \qquad \text{[Equation 3]}$$

16. The method according to claim 12, wherein a polishing rate ($R_O$) for the silicon oxide film ranges from approximately 1,000 Å/min to approximately 5,000 Å/min, a polishing rate ($R_N$) for the silicon nitride film ranges from approximately 400 Å/min to approximately 3,000 Å/min, and a polishing rate ($R_{Cu}$) for the copper electrode ranges from approximately 1,000 Å/min to approximately 5,000 Å/min.

17. The method according to claim 12, wherein, after the polishing, a height difference between a polished surface of the copper electrode and a polished surface of the silicon nitride film is less than approximately 5 nm.

18. The method according to claim 12, wherein, after the polishing, a height difference between a polished surface of the copper electrode and a polished surface of the silicon oxide film is less than approximately 20 nm.

19. The method according to claim 12, wherein the additive comprises one or more selected from the group consisting of an azole-based compound, a phosphoric acid-based compound, a fluorine-based compound, an organic acid, and a combination thereof.

20. The method according to claim 12, wherein, for the abrasive grains, a value obtained by dividing D90 by D80 ranges from 1 to 1.5, wherein D90 represents an 90% cumulative mass particle size distribution diameter, and D80 represents an 80% cumulative mass particle size distribution diameter.

* * * * *